(12) United States Patent
Boswell et al.

(10) Patent No.: US 10,450,119 B2
(45) Date of Patent: Oct. 22, 2019

(54) FILMS INCLUDING A WATER-SOLUBLE LAYER AND A VAPOR-DEPOSITED INORGANIC COATING

(71) Applicant: The Procter & Gamble Company, Cincinnati, OH (US)

(72) Inventors: Emily Charlotte Boswell, Cincinnati, OH (US); Srinivas Krishnaswamy Mirle, Liberty Township, OH (US); Vesselin Nikolov Shanov, Cincinnati, OH (US); Rachit Malik, Hillsboro, OR (US); Colin William McConnell, Loveland, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 16/015,270

(22) Filed: Jun. 22, 2018

(65) Prior Publication Data

US 2018/0370703 A1 Dec. 27, 2018

Related U.S. Application Data

(60) Provisional application No. 62/523,303, filed on Jun. 22, 2017, provisional application No. 62/523,295, filed on Jun. 22, 2017.

(51) Int. Cl.
*B32B 3/12* (2006.01)
*B32B 27/30* (2006.01)
(Continued)

(52) U.S. Cl.
CPC .............. *B65D 65/46* (2013.01); *B32B 3/16* (2013.01); *B32B 3/26* (2013.01); *B32B 27/306* (2013.01); *B65D 65/42* (2013.01); *C11D 17/042* (2013.01); *C23C 16/40* (2013.01); *C23C 16/401* (2013.01); *C23C 16/403* (2013.01); *C23C 16/405* (2013.01); *B32B 15/08* (2013.01); *B32B 18/00* (2013.01); *B32B 2307/7166* (2013.01); *B32B 2307/724* (2013.01); *B32B 2307/726* (2013.01);
(Continued)

(58) Field of Classification Search
None
See application file for complete search history.

(56) References Cited

U.S. PATENT DOCUMENTS 3,198,740 A * 8/1965 Dunlop, Jr. ............ C11D 3/062
206/524.4
5,411,591 A * 5/1995 Izu ......................... B65D 65/42
118/718
(Continued)

FOREIGN PATENT DOCUMENTS

FR 1540337 A * 9/1968 ............ B32B 15/08
JP 05170888 A * 7/1993
(Continued)

OTHER PUBLICATIONS

Machine Translation of JP 09150476 A, Jun. 1997 (Year: 1997).*
(Continued)

*Primary Examiner* — Jeffrey A Vonch
(74) *Attorney, Agent, or Firm* — Daniel S. Albrecht; Jason J. Camp

(57) ABSTRACT

Films including a water-soluble layer and a vapor-deposited inorganic coating are disclosed. The films exhibit enhanced barrier properties.

18 Claims, 8 Drawing Sheets

(51) Int. Cl.

| | | |
|---|---|---|
| *C11D 17/04* | (2006.01) | |
| *B65D 65/46* | (2006.01) | |
| *C23C 16/40* | (2006.01) | |
| *B65D 65/42* | (2006.01) | |
| *B32B 3/26* | (2006.01) | |
| *B32B 3/16* | (2006.01) | |
| *B32B 18/00* | (2006.01) | |
| *B32B 15/08* | (2006.01) | |
| *C23C 14/20* | (2006.01) | |
| *C23C 14/58* | (2006.01) | |
| *C23C 16/02* | (2006.01) | |
| *C23C 14/00* | (2006.01) | |
| *C23C 16/01* | (2006.01) | |
| *C23C 16/513* | (2006.01) | |
| *C08J 7/06* | (2006.01) | |

(52) U.S. Cl.
CPC ....... *B32B 2329/04* (2013.01); *B32B 2439/00* (2013.01); *C08J 7/06* (2013.01); *C08J 2329/04* (2013.01); *C23C 14/0005* (2013.01); *C23C 14/20* (2013.01); *C23C 14/5886* (2013.01); *C23C 16/01* (2013.01); *C23C 16/0245* (2013.01); *C23C 16/513* (2013.01); *Y10T 428/1338* (2015.01); *Y10T 428/1341* (2015.01); *Y10T 428/265* (2015.01)

(56) References Cited

U.S. PATENT DOCUMENTS

| | | | | |
|---|---|---|---|---|
| 5,556,711 | A * | 9/1996 | Ajioka | B32B 15/08 428/460 |
| 5,645,923 | A * | 7/1997 | Matsuo | B05D 7/04 428/215 |
| 5,763,033 | A | 6/1998 | Tropsha et al. | |
| 5,981,029 | A * | 11/1999 | Harada | C08J 7/047 428/143 |
| 6,083,628 | A * | 7/2000 | Yializis | B05D 1/60 428/461 |
| 6,602,564 | B1 * | 8/2003 | Komori | C08J 7/045 428/213 |
| 7,138,452 | B2 | 11/2006 | Kim et al. | |
| 7,691,485 | B2 | 4/2010 | Moriyama et al. | |
| 7,781,506 | B2 | 8/2010 | Urian et al. | |
| 7,928,166 | B2 | 4/2011 | Shibutani | |
| 8,026,302 | B2 | 9/2011 | Shibutani et al. | |
| 9,593,254 | B2 | 3/2017 | Inoue et al. | |
| 9,657,388 | B2 | 5/2017 | Ebata et al. | |
| 2002/0006485 | A1* | 1/2002 | Bening | B32B 27/08 428/35.4 |
| 2003/0068534 | A1* | 4/2003 | Ohkawa | C08J 7/06 428/701 |
| 2004/0072708 | A1* | 4/2004 | Duffield | B65B 9/04 510/293 |
| 2004/0076778 | A1* | 4/2004 | Mori | B32B 27/00 428/35.2 |
| 2004/0149759 | A1* | 8/2004 | Moser | F17C 1/10 220/581 |
| 2005/0118428 | A1* | 6/2005 | Bicker | B05D 1/62 428/411.1 |
| 2006/0213801 | A1* | 9/2006 | Karaoren | C11D 17/042 206/524.7 |
| 2007/0178299 | A1* | 8/2007 | Verrall | B82Y 30/00 428/323 |
| 2008/0146481 | A1 | 6/2008 | Brown et al. | |
| 2009/0022981 | A1* | 1/2009 | Yoshida | C08J 7/045 428/336 |
| 2009/0110888 | A1* | 4/2009 | Wuest | B32B 27/28 428/200 |
| 2009/0130778 | A1* | 5/2009 | Kalgutkar | C23C 14/0005 436/526 |
| 2009/0142227 | A1 | 6/2009 | Fuchs et al. | |
| 2009/0250370 | A1 | 10/2009 | Whitchurch | |
| 2009/0252893 | A1* | 10/2009 | Ozaki | C23C 16/45595 427/579 |
| 2010/0143710 | A1* | 6/2010 | Dickey | C23C 16/405 428/336 |
| 2010/0178523 | A1* | 7/2010 | Iyengar | B32B 23/06 428/458 |
| 2011/0045251 | A1* | 2/2011 | Kazeto | C08J 7/047 428/174 |
| 2011/0076511 | A1* | 3/2011 | Paolilli | B29C 55/023 428/614 |
| 2011/0223401 | A1* | 9/2011 | Harlin | C23C 16/45525 428/216 |
| 2011/0236664 | A1* | 9/2011 | Ortolani | B32B 7/12 428/219 |
| 2011/0281167 | A1 | 11/2011 | Sabi et al. | |
| 2013/0034667 | A1* | 2/2013 | Hunt | C23C 16/40 427/569 |
| 2014/0030510 | A1* | 1/2014 | Kimura | C23C 14/10 428/336 |
| 2014/0050934 | A1* | 2/2014 | Siegenthaler | B32B 15/08 428/458 |
| 2014/0170424 | A1* | 6/2014 | Honda | B05D 3/007 428/446 |
| 2015/0004395 | A1* | 1/2015 | Nonaka | B32B 15/082 428/323 |
| 2015/0118544 | A1 | 4/2015 | Oukassi | |
| 2015/0210969 | A1* | 7/2015 | Brandt-Sanz | B65D 75/322 510/220 |
| 2015/0291813 | A1* | 10/2015 | Nishio | C23C 16/401 428/446 |
| 2015/0368384 | A1 | 12/2015 | Shibutani et al. | |
| 2016/0017491 | A1* | 1/2016 | Koyama | B32B 27/06 428/334 |
| 2016/0186309 | A1 | 6/2016 | Henderson | |
| 2017/0130061 | A1 | 5/2017 | Baker et al. | |
| 2017/0152093 | A1* | 6/2017 | Simonsen | B65D 65/46 |
| 2017/0239686 | A1* | 8/2017 | Jahromi | B05D 1/60 |
| 2017/0259961 | A1 | 9/2017 | O'Donnell et al. | |
| 2017/0259971 | A1 | 9/2017 | O'Donnell et al. | |
| 2017/0259972 | A1 | 9/2017 | O'Donnell et al. | |
| 2018/0290440 | A1 | 10/2018 | Boswell | |
| 2018/0291162 | A1 | 10/2018 | Boswell | |
| 2018/0369859 | A1* | 12/2018 | Boswell | B05D 1/60 |

FOREIGN PATENT DOCUMENTS

| | | | | | |
|---|---|---|---|---|---|
| JP | | 07166328 | A * | 6/1995 | |
| JP | | 09076400 | A * | 3/1997 | |
| JP | | 09150476 | A * | 6/1997 | |
| JP | | 11192675 | A * | 7/1999 | |
| JP | | 2004285143 | | 10/2004 | |
| JP | | 2006312313 | | 11/2006 | |
| JP | | 2014051328 | A * | 3/2014 | ............ B32B 15/08 |
| JP | | 2016020085 | | 2/2016 | |
| JP | | 2016121204 | | 7/2016 | |
| WO | WO2016132859 | A1 | | 8/2016 | |

OTHER PUBLICATIONS

Nichigo G-Polymer Application Examples. (n.d.). Retrieved Mar. 29, 2018, from http://www.g-polymer.com/eng/youtorei1/.
Nichigo G-Polymer product development concept. (n.d.). Retrieved Mar. 29, 2018, from http://www.g-polymercom/eng/kaihatukonseputo/.
Nichigo G-Polymer. (n.d.). Retrieved Mar. 29, 2018, from http://www.g-polymercom/eng/.
Overview of G-Polymer Products. (n.d.). Retrieved Mar. 29, 2018, from http://www.g-polymer.com/eng/syouai/.
Overview of G-Polymer types. (n.d.). Retrieved Mar. 29, 2018, from http://www.g-polymer.com/eng/grades/.
All Office Actions for U.S. Appl. No. 15/942,902.
All Office Actions for U.S. Appl. No. 15/942,865.
All Office Actions for U.S. Appl. No. 16/015,252.
Search Report and Written Opinion for PCT/US2018/038895 dated Oct. 5, 2018.

(56) References Cited

OTHER PUBLICATIONS

U.S. Appl. No. 16/015,252, filed Jun. 22, 2018, Boswell et al.

* cited by examiner

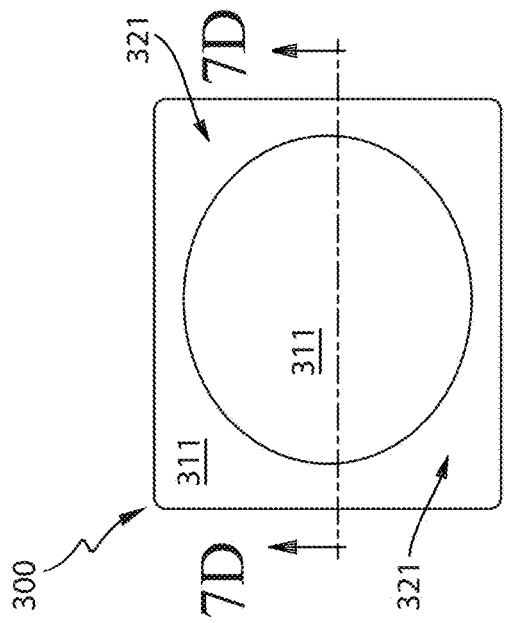
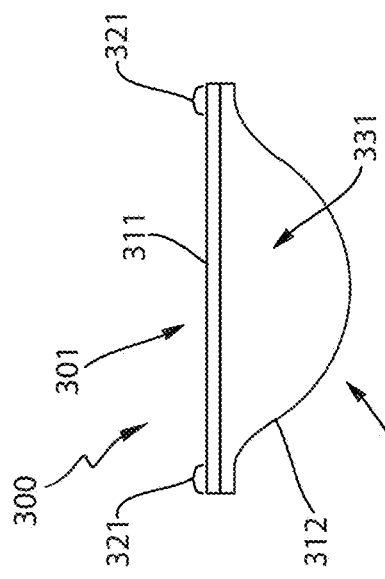
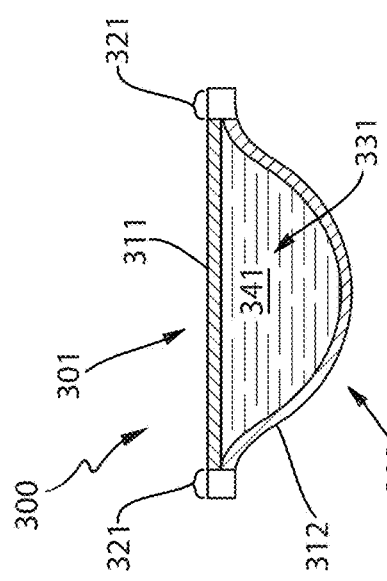
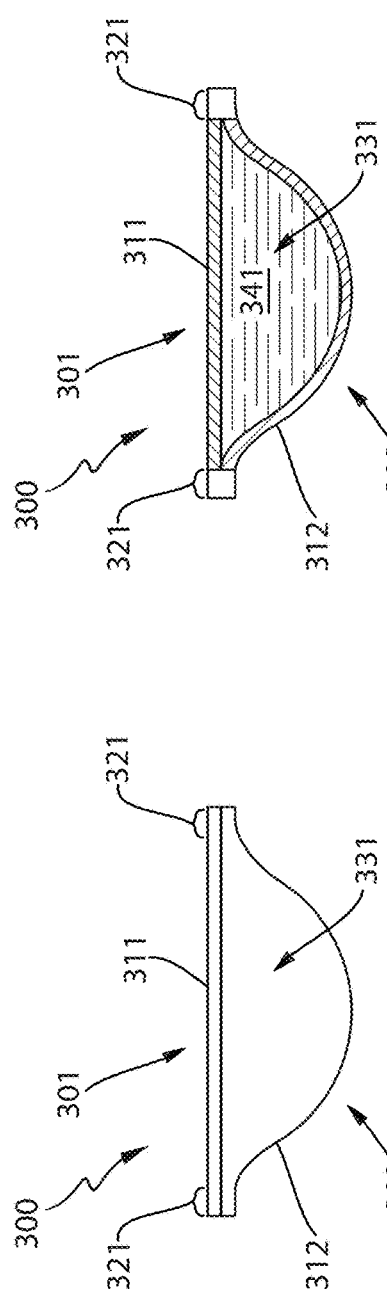
FIG. 7A
FIG. 7B
FIG. 7C
FIG. 7D

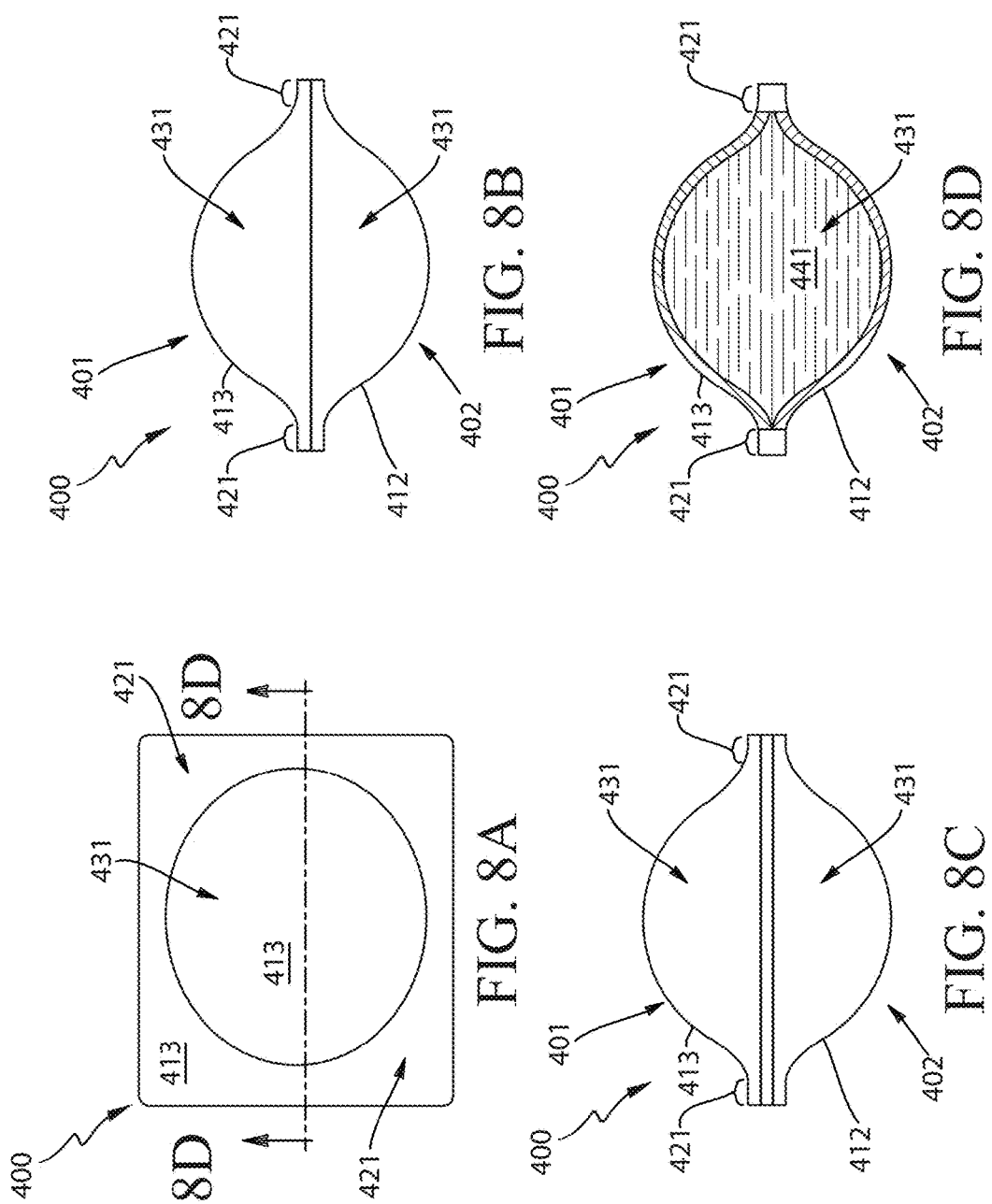

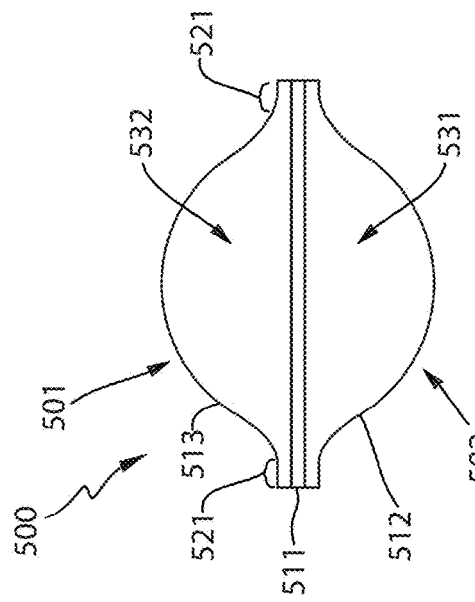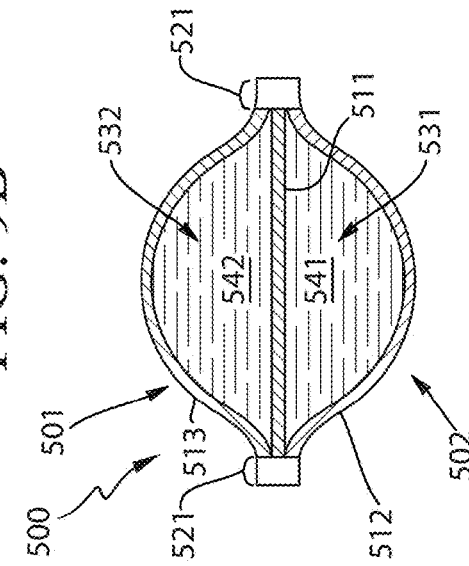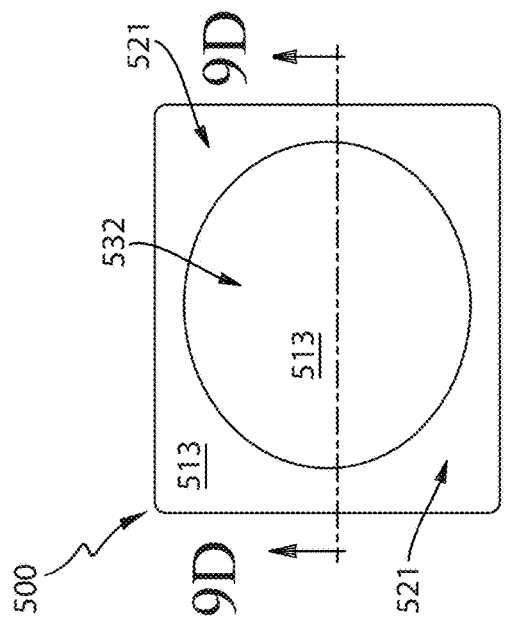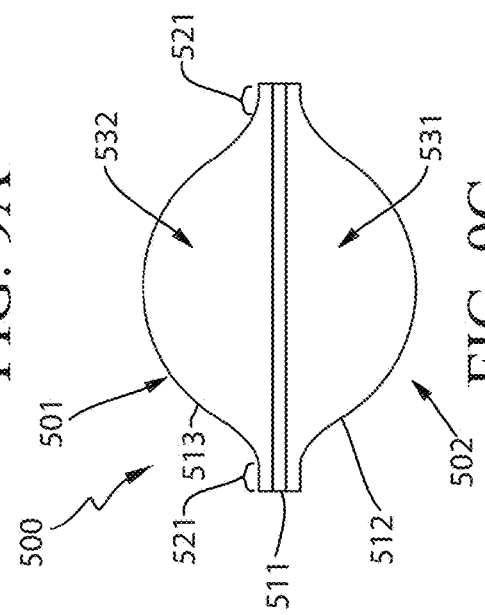

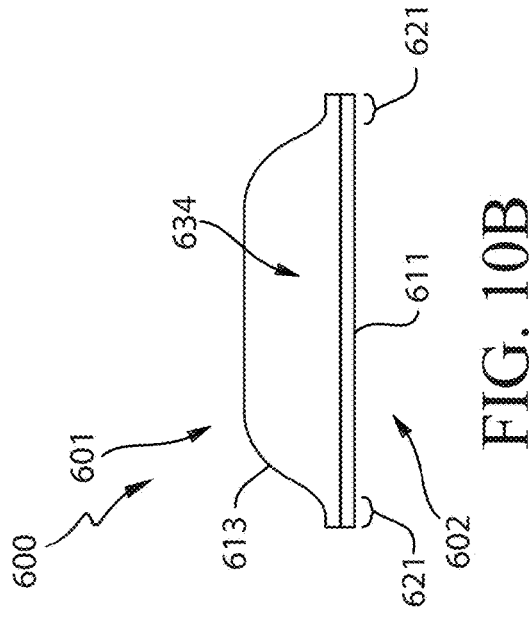
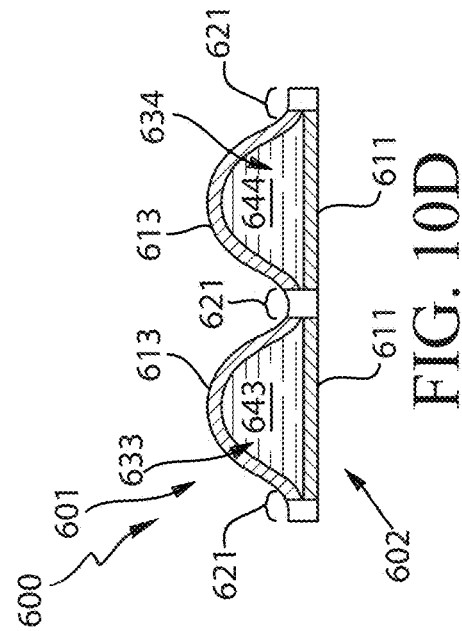
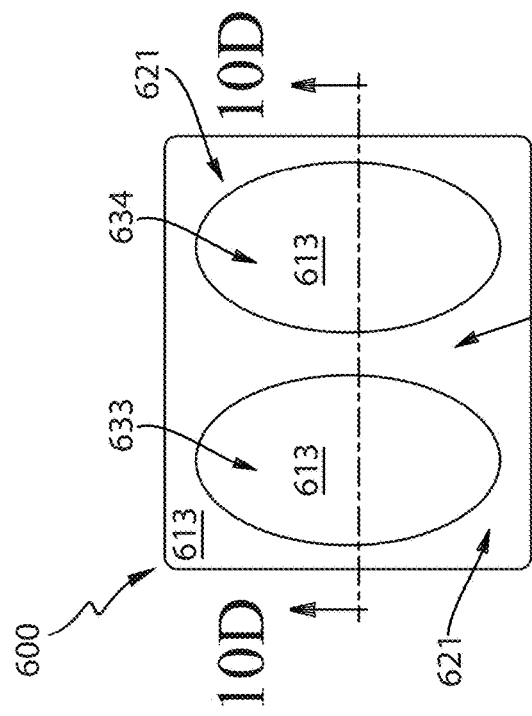
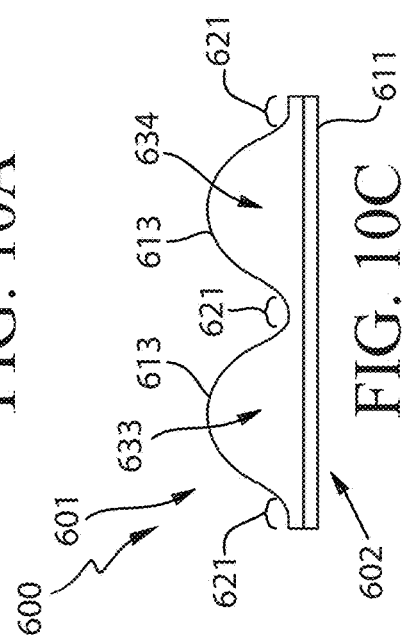

FILMS INCLUDING A WATER-SOLUBLE LAYER AND A VAPOR-DEPOSITED INORGANIC COATING

TECHNICAL FIELD

The present disclosure generally relates to films including a water-soluble layer and a vapor-deposited inorganic coating.

BACKGROUND

Polymeric films including water-soluble components are useful in the construction of various articles and packaging. For example, such polymeric films can be used in health and hygiene products, including disposable diapers and training pants, incontinence articles, and feminine care products (e.g., pads and liners), in medical products such as bags for bodily fluids and/or waste (e.g., ostomy pouches), and in other household products such as trash bags, laundry bags, hamper liners, etc. Such polymeric films also can be used to form packaging for a variety of compounds. For example, the polymeric films can advantageously be formed into packaging for detergents, agrochemicals, water treatment chemicals, natural cleaning products containing bacteria/microbes, dyes, food, laundry, embroidery, beauty, personal care products, shaving products, health care products, and pharmaceuticals. The packaging can simplify dispersing, pouring, dissolving, and/or dosing of the contents contained within the packaging by eliminating the need to measure the contents, directly handle the contents, or dispense the contents. An example of a specific type of packaging advantageously formed from a water-soluble polymeric film is a soluble unit dose article. Soluble unit dose articles are useful to facilitate the delivery of predetermined quantities of one or more compositions, such as cleaning detergents, contained within the article. Soluble packaging can also be useful for solving some of the issues regarding trash entering waterways and oceans. For example, most packaging made from soluble films would not leave any litter in waterways or oceans, because the package would eventually dissolve and the remaining polymer would biodegrade. Known polymeric films including a water-soluble component suffer from a number of detriments however, including the migration of compounds and elements through the films. Also, water impinging on the package before intended contact such as from wet hands while handling can damage or weaken the package causing unintended leaking. Such detriments can limit the contents and usability of articles and packaging formed from the polymeric films.

SUMMARY

According to one embodiment, a film includes a layer of water-soluble polymeric material and a first vapor-deposited inorganic coating joined at least one surface of the layer of water-soluble polymeric material. The first vapor-deposited inorganic coating includes a metal oxide. The first vapor-deposited inorganic coating defines a plurality of microfractures extending along the surface of the inorganic coating.

According to another embodiment, a film includes a layer of water-soluble polyvinyl alcohol and a vapor-deposited inorganic coating joined to at least one surface of the layer of polyvinyl alcohol. The vapor-deposited inorganic coating includes a metal oxide and has a thickness of about 2 nanometers to about 1000 nanometers. The vapor-deposited inorganic coating defines a plurality of microfractures extending along the surface of the inorganic coating. Each of the plurality of microfractures has a length from about 5 microns to about 50 microns. The film has a thickness of about 76 microns and exhibits a water vapor transmission rate of about 2,000 g/(m$^2$·day) to about 5,500 g/(m$^2$·day) when measured in accordance to the Water Vapor Transmission Rate Test method.

According to another embodiment, a film includes a layer of water-soluble polyvinyl alcohol and a vapor-deposited inorganic coating joined to at least one surface of the layer of polyvinyl alcohol. The vapor-deposited inorganic coating includes a metal oxide and has a thickness of about 2 nanometers to about 1000 nanometers. The vapor-deposited inorganic coating defines a plurality of microfractures extending along the surface of the inorganic coating. Each of the plurality of microfractures has a length from about 5 microns to about 50 microns. The film has a thickness of about 76 microns and exhibits an oxygen transmission rate of about 7.75 cc/(m$^2$·day) [0.5 cc/(100 in$^2$·day)] to about 38.75 cc/(m$^2$·day) [2.5 cc/(100 in$^2$·day)] when measured in accordance with the Oxygen Transmission Rate Test method.

According to another embodiment, a method of forming a film includes providing a layer of water-soluble polymeric material, vapor depositing an inorganic coating to at least one surface of the layer of water-soluble polymeric material, and forming a plurality of microfractures extending along the surface of the inorganic coating. The inorganic coating includes a metal oxide.

BRIEF DESCRIPTION OF THE DRAWINGS

FIG. 7A illustrates a top view of a unit dose article having a flat top, a rounded bottom, and a compartment according to one example.

FIG. 7B illustrates a side view of the unit dose article of FIG. 7A.

FIG. 7C illustrates an end view of the unit dose article of FIG. 7A.

FIG. 7D illustrates a cross-sectional end view of the unit dose article of FIG. 7A.

FIG. 8A illustrates a top view of a unit dose article having a rounded top, a rounded bottom, and a compartment according to one example.

FIG. 8B illustrates a side view of the unit dose article of FIG. 8A.

FIG. 8C illustrates an end view of the unit dose article of FIG. 8A.

FIG. 8D illustrates a cross-sectional end view of the unit dose article of FIG. 8A.

FIG. 9A illustrates top view of an exemplary soluble unit dose article having a rounded top, a rounded bottom, and two overlapping compartments according to one embodiment.

FIG. 9B illustrates a side view of the unit dose article of FIG. 9A.

FIG. 9C illustrates an end view of the unit dose article of FIG. 9A.

FIG. 9D illustrates a cross-sectional end view of the unit dose article of FIG. 9A.

FIG. 10A illustrates an exemplary soluble unit dose article having a rounded top, a flat bottom, and two side-by-side compartments according to one embodiment.

FIG. 10B illustrates a side view of the unit dose article of FIG. 10A.

FIG. 10C illustrates an end view of the unit dose article of FIG. 10A.

FIG. 10D illustrates a cross-sectional end view of the unit dose article of FIG. 10A.

DETAILED DESCRIPTION

Definitions

As used herein, when the term "about" modifies a particular value, the term refers to a range equal to the particular value, plus or minus twenty percent (+/−20%). For any of the embodiments disclosed herein, any disclosure of a particular value, can, in various alternate embodiments, also be understood as a disclosure of a range equal to about that particular value (i.e. +/−20%).

As used herein, when the term "approximately" modifies a particular value, the term refers to a range equal to the particular value, plus or minus fifteen percent (+/−15%). For any of the embodiments disclosed herein, any disclosure of a particular value, can, in various alternate embodiments, also be understood as a disclosure of a range equal to approximately that particular value (i.e. +/−15%).

As used herein, when the term "nearly" modifies a particular value, the term refers to a range equal to the particular value, plus or minus five percent (+/−5%). For any of the embodiments disclosed herein, any disclosure of a particular value, can, in various alternate embodiments, also be understood as a disclosure of a range equal to approximately that particular value (i.e. +/−5%).

As used herein, when the term "substantially" modifies a particular value, the term refers to a range equal to the particular value, plus or minus ten percent (+/−10%). For any of the embodiments disclosed herein, any disclosure of a particular value, can, in various alternate embodiments, also be understood as a disclosure of a range equal to approximately that particular value (i.e. +/−10%).

As used herein, the term "copolymer" means a polymer formed from two, or more, types of monomeric repeating units. The term "copolymer" as used herein further encompasses terpolymers, such as terpolymers having a distribution of vinyl alcohol monomer units, vinyl acetate monomer units, and butene diol monomer units. If the copolymer is substantially fully hydrolyzed, substantially no vinyl acetate monomeric units may be present.

Films Including a Water-Soluble Layer and a Vapor-Deposited Inorganic Coating

Figure 1:
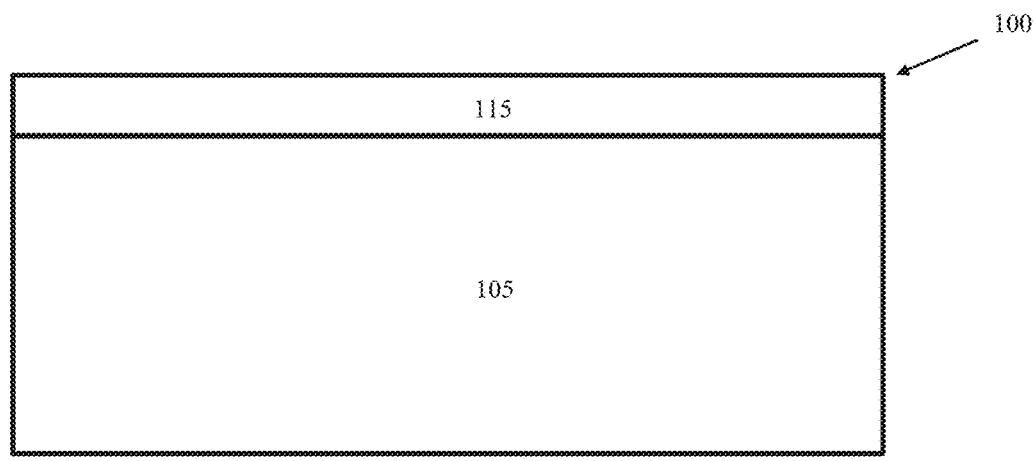
FIG. 1 depicts a cross-sectional view of a film according to one embodiment.

As will be described herein, films including a water-soluble layer and a vapor-deposited inorganic coating are disclosed. For example, a cross-sectional view of an exemplary film is depicted in FIG. 1. As illustrated in FIG. 1, a film 100 can include a water-soluble layer 105 formed of a water-soluble polymeric material and a vapor-deposited inorganic coating 115 joined to one surface of the water-soluble layer 105.

As can be appreciated, the films described herein can have many variations. For example, a film can include a vapor-deposited inorganic coating on only one surface of the water-soluble layer as depicted in FIG. 1 or can have a vapor-deposited inorganic coating on both surfaces of the water-soluble layer in certain embodiments (not depicted). Additional layers, such as an indicia layer, can also be included in certain embodiments.

In certain embodiments, multiple coatings can be vapor-deposited. For example, in certain embodiments, a film can include a water-soluble layer and multiple vapor-deposited inorganic coating layers.

In certain embodiments, a film can include more than one water-soluble layer. For example, a film as described herein can include two water-soluble layers, three water-soluble layers, five water-soluble layers, or more water-soluble layers in various embodiments.

Vapor-Deposited Inorganic Coating

It has been found that application of a vapor-deposited inorganic coating can improve the properties and performance of a film in numerous ways. For example, films including a vapor-deposited inorganic coating can exhibit desirable chemical and physical properties including improved barrier properties, controlled dissolution times, and decreased tackiness when compared to the uncoated film. These improved properties can make such films useful for the formation of products typically formed from uncoated water-soluble films including water-soluble articles and water-soluble packaging materials. As can be appreciated however, the films described herein can also be useful for other articles and applications due to the excellent mechanical and chemical properties exhibited by the films.

In certain embodiments, suitable vapor-deposited inorganic coatings can be formed of metal oxides and related compounds. As used herein, metal oxides include aluminum oxides, magnesium oxides, titanium oxides, zinc oxides, metalloid oxides such as silicon oxides, silicon oxycarbides, and silicon nitrides. As can be appreciated, metal oxides can be vapor-deposited using a variety of processes. For example, a metal oxide coating can be vapor-deposited using a chemical vapor deposition process or a physical vapor deposition process in various embodiments. Generally, most chemical vapor deposition processes can be suitable due to the stability of the metal oxides and metal oxide precursors. Within these oxide chemistries various stochiometries are possible and when we refer to an oxide we refer to any of the possible stochiometries.

In certain embodiments, a plasma-assisted chemical vapor deposition process can be used to form the vapor-deposited inorganic coating. Plasma-assisted chemical vapor deposition is a modified chemical vapor deposition process in which thermal activation energy is provided by an energetic plasma instead of direct heat. Plasma-assisted chemical vapor deposition processes useful for the films described herein include the steps of vaporizing a metal oxide precursor, introducing plasma to thermally modify the precursor and form intermediate compounds, and cooling the intermediate compounds to form a coating on at least one surface of a water-soluble layer. Plasma-assisted chemical vapor deposition processes can be particularly advantageous because such processes can provide the thermal energy necessary for the vapor deposition process without melting, or otherwise damaging, the water-soluble layer.

To form metal oxide coatings, various precursor compounds can be vaporized. For example, tetramethylsilane ("TMS") and trimethylaluminum ("TMA") can respectively be vaporized to form silicon dioxide ("$SiO_2$") and aluminum oxide ("$Al_2O_3$") coatings. Hexamethyldisilazane ("HMDS"), hexamethyldisiloxane ("HMDSO"), and tetraethylorthosilicate ("TEOS") can similarly be vaporized be used to form silicon oxide ("$SiO_x$") coatings.

In certain embodiments, an atomic layer chemical vapor deposition process can alternatively be used. Atomic layer deposition is a chemical vapor deposition process based on sequential, self-saturating surface reactions. In such processes, the metal oxide precursors are pulsed into a chemical vapor deposition chamber and allowed to build up layer by layer.

In certain embodiments, a physical vapor deposition process can alternatively be utilized. Physical vapor deposition processes differ from chemical vapor deposition processes by instead using physical processes such as heating, or sputtering, to produce vapor from a solid precursor. The vaporized compound adsorbs onto the substrate to directly form a thin layer. In certain embodiments, suitable physical vapor deposition processes to form an inorganic layer can include sputtering, such as magnetron sputtering, thermal evaporation, and electron beam ("e-beam") evaporation.

As can be appreciated, physical vapor deposition processes do not require the use of a precursor compound and instead directly vaporize the material of the final coating. For example, an aluminum oxide coating can be formed on the surface of a water-soluble layer by sputtering, or e-beam evaporation, of solid aluminum oxide pellets or granules.

In certain embodiments, an example of a device that can be used to form a coating of Al2O3 via physical vapor deposition is a Temescal FC 1800 E-beam Evaporator. In this device the distance between the target and substrate is about 45 cm, the energy of the electron beam is 450 W (using 950 KV at 50 uA) and before beginning deposition, the chamber is pumped down to a vacuum level of about 1×10−5 Torr.

It has been unexpectedly discovered that it can be advantageous in certain embodiments for the vapor-deposited inorganic coating to have a plurality of microfractures extending along at least the surface of the inorganic coating. Without being bound by theory, it is theorized that microfractures can allow for the films described herein to retain excellent water-solubility by allowing water to penetrate, in a controlled manner, through the inorganic coating and eventually dissolve the underlying water-soluble layer. Unexpectedly, the microfractures do not interfere with some benefits, such as improved barrier properties and reduced tackiness, conferred by the vapor-deposited inorganic coating.

Generally, a plurality of microfractures can be formed in a vapor-deposited inorganic coating using one or more of a variety of processes or controlled parameters. For example, certain processing conditions can be used to form microfractures in the vapor-deposited inorganic coating. In certain embodiments, the processing conditions can be mechanical treatments such as stretching, bending, or an out-of-plane deformation. As can be appreciated, the mechanical treatment can be applied to the film during web processing of the film or during the process used to manufacture an article. For example, if a unit dose article is formed from a film described herein, the stretching caused by the formation of the soluble unit dose article can act as a mechanical treatment.

Additionally, or alternatively, certain parameters of the vapor-deposited inorganic coating, such as the thickness of the coating, can be selected to favor formation of microfractures. It has been unexpectedly discovered that relatively thicker inorganic coatings can have a greater propensity for microfracture formation. For example, coatings having a thickness of about 300 nanometers, or thicker, can have a greater propensity to fracture or to develop microfractures after a mechanical treatment is applied.

In certain embodiments, the microfractures can have a length from about 2.5 microns to about 100 microns, or any integer value from about 2.5 microns to about 100 microns, or any range formed by any of the preceding values such as about 5 microns to about 50 microns, about 10 microns to about 25 microns, etc. In certain embodiments, the microfractures can have a width of about 5 microns to about 0.001 microns, or any integer value from about 5 microns to about 0.001 microns, or any range formed by any of the preceding values such as about 5 microns to about 0.5 microns, about 2.5 microns to about 1 micron, etc. As can be appreciated, combinations of multiple microfractures, or the like, can cause a portion of the microfractures to have lengths and widths outside of the ranges described herein.

In certain embodiments, bounding of the microfractures can define a plurality of discrete regions on the vapor-deposited inorganic coating. The discrete regions can be approximately uniform in size and shape in certain embodiments. For example, the discrete regions can be generally rectangular or square in shape in certain embodiments. In certain embodiments, the length and width of each discrete region can independently be about 150 microns to about 10 microns, or any integer value from about 150 microns to about 10 microns, or any range formed by any of the preceding values such as about 100 microns to about 50 microns, about 15 microns to about 50 microns, etc. For example, in certain embodiments, a vapor-deposited inorganic coating can have a plurality of discrete regions having a length of about 35 microns and a width of about 35 microns.

FIGS. 2 to 6 depict scanning electron microscope ("SEM") images of a 76 micron film having a 1,000 nanometer thick aluminum oxide ($Al_2O_3$) vapor-deposited coating. The microscopy photograph of FIG. 2 has a magnification power of 150× and is in an unstretched state. As illustrated by the 1000× magnification of FIG. 3, the unstretched film of FIG. 2 includes a small number of microfractures.

Figure 2:
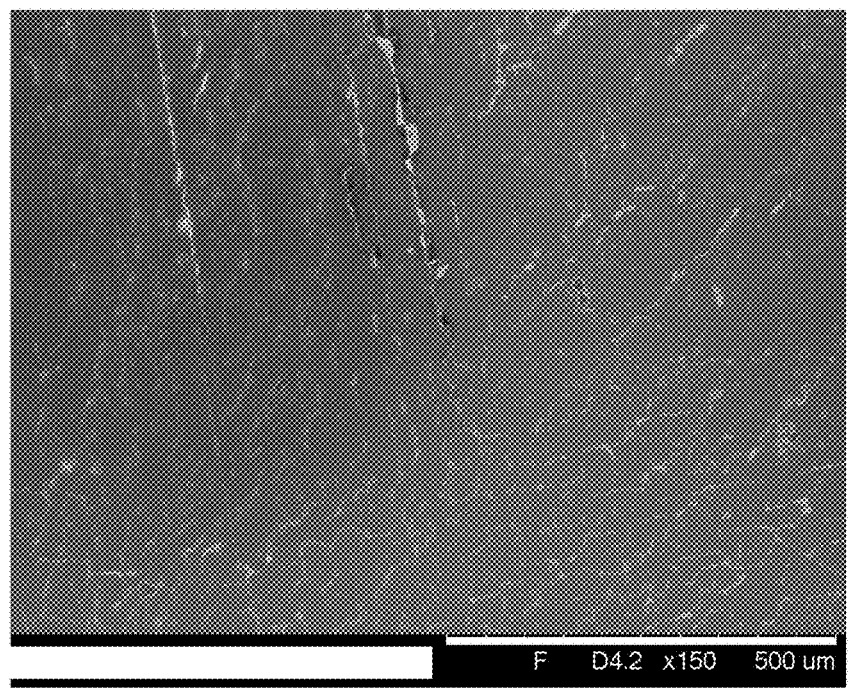
FIG. 2 is a microscopy photograph illustrating a vapor-deposited inorganic coating having a plurality of microfractures.
Figure 3:
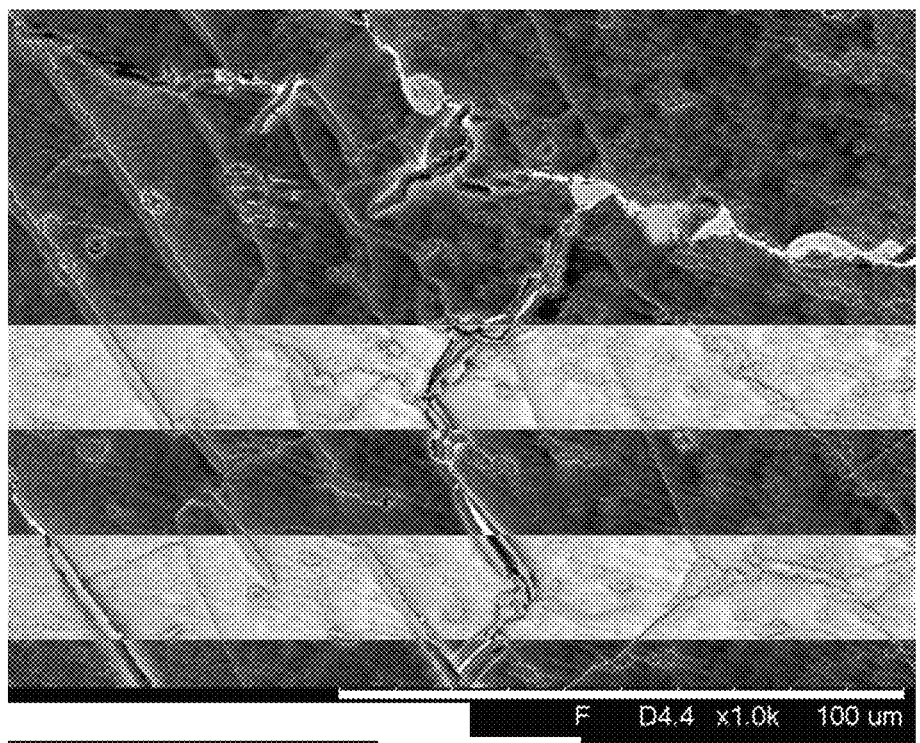
FIG. 3 is a microscopy photograph of the vapor-deposited inorganic coating depicted in FIG. 2 at a greater magnification.
Figure 4:
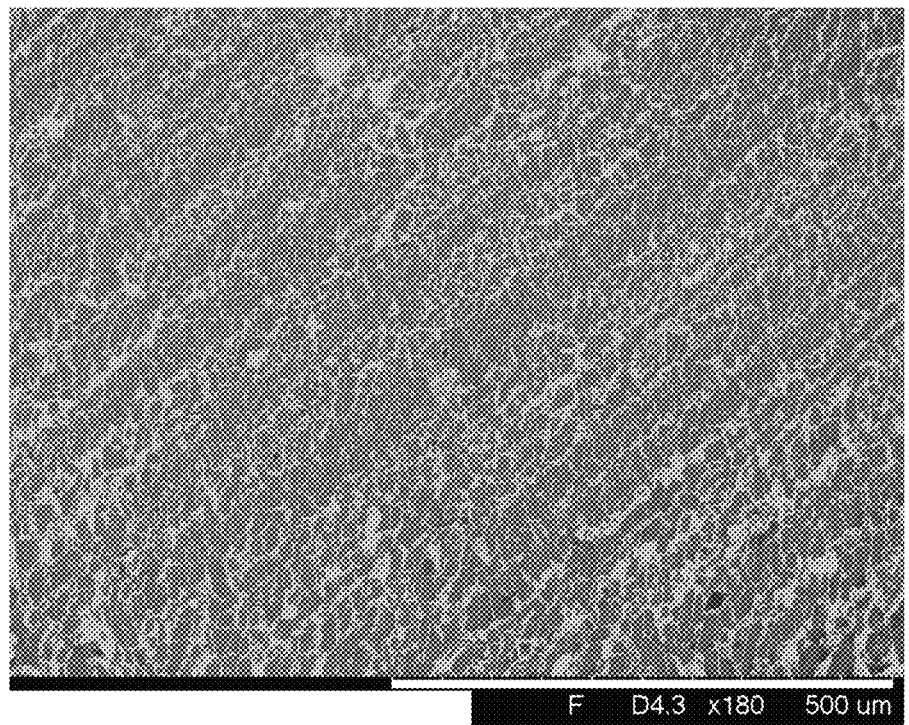
FIG. 4 is a microscopy photograph of the vapor-deposited inorganic coating depicted in FIGS. 2 and 3 after stretching 150%.
Figure 5:
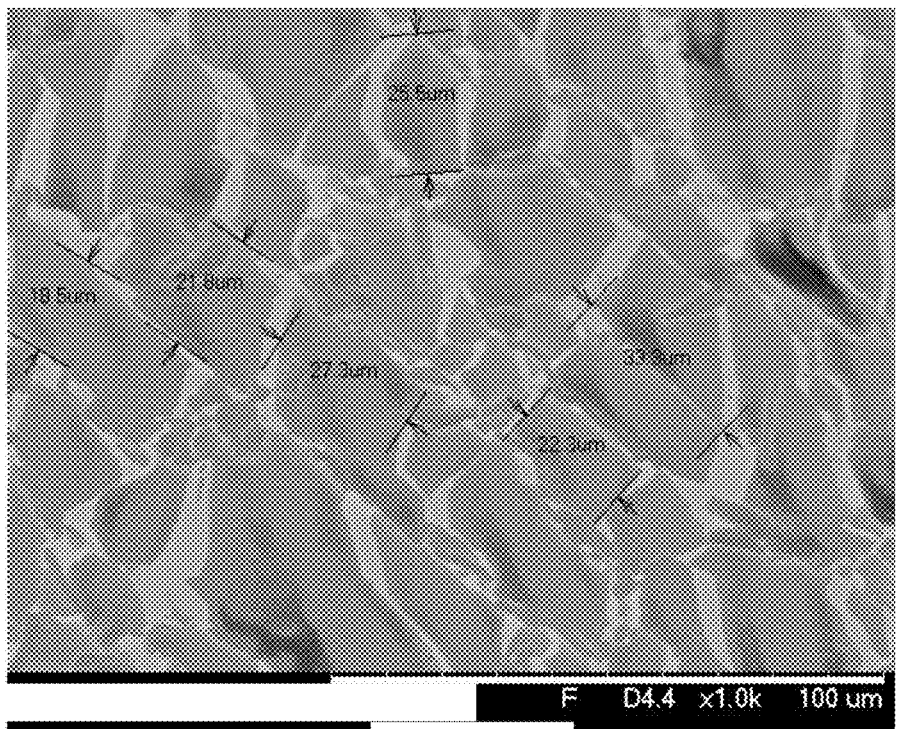
FIG. 5 is a microscopy photograph of the vapor-deposited inorganic coating depicted in FIG. 4 at a greater magnification.
Figure 6:
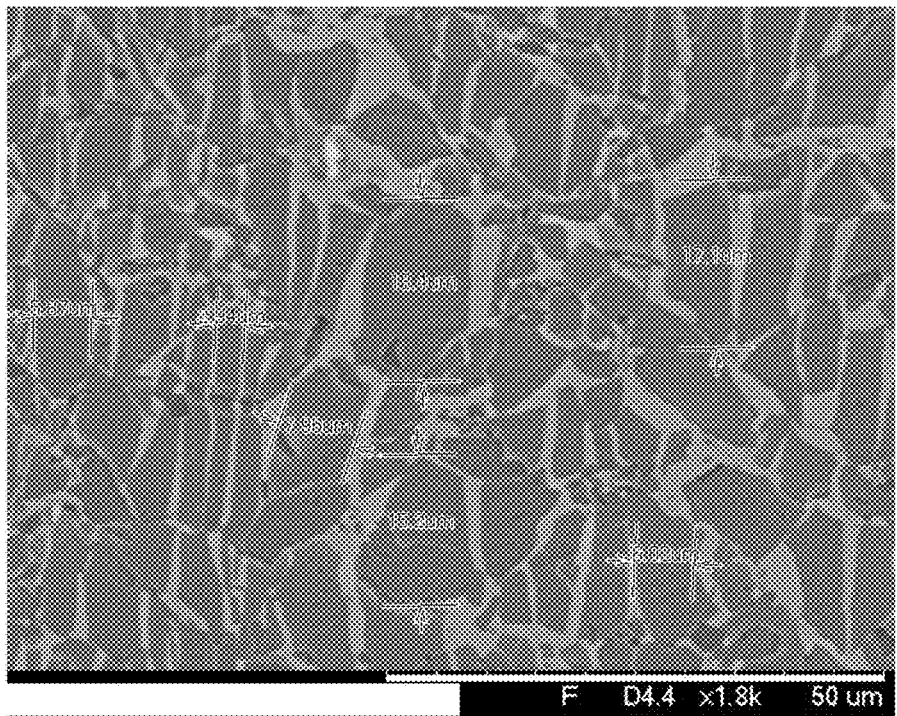
FIG. 6 is a microscopy photograph of the vapor-deposited inorganic coating depicted in FIG. 5 at a greater magnification.

FIGS. 4 to 6 depict the film of FIGS. 2 and 3 after bilateral stretching to 150% of its original size. FIG. 4 illustrates a low magnification (180×) image of the film. FIGS. 5 and 6 illustrate high magnification (1000×, 1800×) images of the film. As illustrated by FIGS. 5 and 6, the vapor-deposited inorganic coating has a plurality of discrete regions bounded by microfractures.

As can be appreciated, each of the microfractures present in the vapor-deposited inorganic coating can extend through the entire thickness of the coating or can extend only partially through the thickness of the coating. For example, certain microfractures can be present only along the outer surface of the vapor-deposited inorganic coating. In certain embodiments, each of the microfractures can extend through the entire thickness of the vapor-deposited inorganic coating. In certain embodiments, only certain microfractures can extend through the entire thickness of the vapor-deposited inorganic coating. In certain embodiments, none of the microfractures extend through the entire thickness of the vapor-deposited inorganic coating.

In any of the various embodiments described herein, the thickness of the vapor-deposited inorganic coating can be about 2 nanometers to about 1,000 nanometers, or any integer value from about 2 nanometers to about 1,000 nanometers, or any range formed by any of the preceding values, such as about 100 nanometers to about 500 nanometers, about 100 nanometers to about 300 nanometers, etc.

In certain embodiments, the vapor-deposited inorganic coating can be applied to less than substantially all of the water-soluble layer. For example, the vapor-deposited inorganic coating can be applied to about 50% to about 100% of the water-soluble layer, or any integer percentage from about 50% to about 100% of the water-soluble layer, or any range formed by any of the preceding values such as about 60% or more, or about 95% of the water-soluble layer. In certain embodiments, a mask can be used to apply the vapor-deposited inorganic coating to less than substantially all of the water-soluble layer. As can be appreciated, other methods of reducing the coating area can also be used. For example, the water-soluble layer can be selectively modified to reduce adhesion of a vapor-deposited inorganic coating to select areas. In certain embodiments, the vapor-deposited inorganic coating can be applied to substantially all of the water-soluble layer.

According to certain embodiments, a vapor-deposited inorganic coating can be joined to a layer of water-soluble layer either directly or indirectly. For example, in certain embodiments, an inorganic vapor-deposited coating can be applied directly to an unprocessed water-soluble layer using a chemical vapor deposition process as previously described. As used herein, an unprocessed water-soluble layer refers to a layer which has not undergone any treatment steps, such as ablation, after being cast from a water-soluble polymeric material. As can be appreciated, certain vapor-deposition processes can obviate the need to use treatment steps. For example, a plasma-assisted chemical vapor deposition process can inherently clean the water-soluble layer and can minimize any need to prepare the water-soluble layer prior to application of the inorganic coating.

Alternatively, in certain embodiments, a vapor-deposited inorganic coating can be applied to the water-soluble layer after the water-soluble layer has been prepared by, for example, cleaning. As can be appreciated, cleaning of the water-soluble layer can promote improved adhesion of the vapor-deposited inorganic coating and can minimize any defects in the inorganic coating.

Generally, a water-soluble layer can be cleaned in any suitable manner. For example, a water-soluble layer can be cleaned with a solvent treatment or a physical abrasion treatment in certain embodiments.

In certain embodiments, the water-soluble layer can be cleaned with an ablation process. In such embodiments, one or more surfaces of the water-soluble layer can be at least partially ablated to remove any undesirable material prior to application of the vapor-deposited inorganic coating. Additionally, certain ablation processes, such as plasma ablation processes, can also functionalize the surface and provide functional groups for the vapor-deposited inorganic coating to adhere to.

Generally, any suitable ablation process can be used including, for example, a plasma treatment, a solvent treatment, a flame treatment, a photon ablation treatment, an electron beam irradiation treatment, an ion bombardment treatment, an ultraviolet treatment, a vacuum annealing treatment, or a physical abrasion treatment. For example, a helium-oxygen plasma or an argon-oxygen plasma at a flow rate of 30.0 L/min at 100 W to about 150 W of power can be used to ablate the surface of a water-soluble layer prior to vapor deposition of an inorganic coating in certain embodiments. Other gases can also be used for plasma ablation including nitrogen and ammonia. As can be appreciated, the surface of a water-soluble layer can be partially ablated, substantially fully ablated, or fully ablated in various embodiments.

In certain embodiments, the vapor-deposited inorganic coating can be applied over an intermediate layer. For example, a vapor-deposited inorganic coating can be applied to an indicia layer in certain embodiments.

In certain embodiments, two or more vapor-deposited inorganic coatings can be applied to a water-soluble layer. Generally, each additional vapor-deposited inorganic coating can be applied similarly to the previously described vapor-deposited inorganic coatings.

Water-Soluble Layers

As can be appreciated, the water-soluble layer of the film can be formed of any of a variety of water-soluble polymeric materials. As used herein, water-soluble polymeric materials are materials that, when formed as part of a film, dissolve in about 5 minutes (300 seconds) or less when immersed in water having a temperature of about 20° C. Advantageously, suitable water-soluble layers of a film can dissolve at temperatures of about 24° C. or less, or about 10° C. or less in certain embodiments. In certain embodiments, suitable water-soluble polymeric materials can also dissolve in shorter amounts of time. For example, in certain embodiments, water-soluble polymeric materials can dissolve in about 90 seconds or less when immersed in water having a temperature of about 20° C.

Examples of suitable water-soluble polymeric materials to form layers of the film can include polyvinyl alcohols ("PVOH"), polyvinyl alcohol copolymers, polyvinyl pyrrolidone, polyalkylene oxides such as polyethylene oxide, copolymers of butene diol and vinyl acetate ("BVOH"), acrylamide, acrylic acid, cellulose, cellulose ethers, cellulose esters, cellulose amides, polyvinyl acetates, polycarboxylic acids and salts, polyethylene glycol, polyaminoacids or peptides, polyamides, polyacrylamide, copolymers of maleic/acrylic acids, polysaccharides including starch and gelatin, natural gums such as xanthum and carragum, polyacrylates and water-soluble acrylate copolymers, methylcellulose, carboxymethylcellulose sodium, dextrin, ethylcellulose, hydroxyethyl cellulose, hydroxypropyl methylcellulose, maltodextrin, polymethacrylates, homopolymers thereof, copolymers thereof, and combinations. In certain embodiments, the water-soluble polymeric material can be one or more of a polyvinyl alcohol, a polyvinyl alcohol copolymer, and hydroxypropyl methyl cellulose ("HPMC"). In certain embodiments, the water-soluble polymeric material can be free of carboxylate groups. As can be appreciated however, the present disclosure is not particularly limited and can be used with any other known water-soluble polymeric materials.

The water-soluble polymeric material can have any suitable weight average molecular weight. For example, in certain embodiments, the water-soluble polymeric material can have a weight average molecular weight of about 1,000 to about 1,000,000, or any integer value from about 1,000 to about 1,000,000, or any range formed by any of the preceding values such as about 10,000 to about 300,000, about 20,000 to about 150,000, etc.

In certain embodiments, mixtures of water-soluble polymeric materials can also be used. Mixtures of one or more water-soluble polymeric materials can be useful to control the mechanical and/or dissolution properties of articles formed from the water-soluble polymeric materials. In such embodiments, the water-soluble polymeric materials can be selected on considerations such as the degree of water solubility, mechanical strength, and chemical miscibility of the materials.

In certain embodiments, suitable mixtures of water-soluble polymeric materials can have different weight average molecular weights. For example, a suitable mixture can include a first PVOH polymer, or copolymer thereof, having a weight average molecular weight of about 10,000 to about 40,000 (e.g., about 20,000) and a second PVOH, or copolymer thereof, having a weight average molecular weight of about 100,000 to about 300,000 (e.g., about 150,000). As can be appreciated however, it can also be advantageous in certain embodiments to select water-soluble polymeric materials which have similar molecular weights.

In certain embodiments, suitable water-soluble polymeric materials can be formed of a blend of different polymers or co-polymers. For example, suitable blends can include a polylactic acid polymer and a polyvinyl alcohol polymer. In certain embodiments, about 1% to about 35%, by weight, of the blend can be polylactic acid polymer and about 65% to 99%, by weight, of the blend can be polyvinyl alcohol.

Suitable water-soluble polymeric materials can have any suitable degree of hydrolysis. For example, suitable PVOH polymeric materials can have a degree of hydrolysis of about 60% to about 100% (e.g., about 99.95%), or any integer percentage from about 60% to about 100%, or any range formed by any of the preceding values such as about 60% to about 95%, about 80% to about 90%, etc. As can be appreciated, the degree of hydrolysis can vary depending upon the polymer, desired water solubility, and the molecular weight. For example, a BVOH copolymer can be substantially fully hydrolyzed in certain embodiments while retaining water solubility.

In certain embodiments, the water-soluble layers of films can include relatively small amounts of moisture. The moisture can prevent cracking of the water-soluble layers of a film. Generally, suitable levels of the moisture can include about 2% water to about 15% water by weight of the water-soluble layers. In certain embodiments, suitable levels of the moisture can alternatively include about 3.5% water to about 10% water by weight of the water-soluble layers. As can be further appreciated, the moisture levels can vary depending on environmental conditions and can reach ranges outside of about 2% water to about 15% water. For example, in very dry conditions, the water-soluble layers can reach a moisture level of about 1% water or less. In very humid environments, the water-soluble layers can reach a moisture level of greater than about 15% water.

Certain films described herein can include only a single water-soluble layer formed from any of the water-soluble polymeric materials described herein. In such embodiments, the water-soluble layer can generally be formed at any suitable thickness which demonstrates suitable properties such as barrier strength and solubility. For example, the water-soluble layer can have a thickness of about 5 micrometers to about 300 micrometers, any integer value from about 5 micrometers to about 300 micrometers, or any range formed by any of the preceding values such as 35 micrometers to about 150 micrometers, and about 50 micrometers to about 100 micrometers.

Alternatively, a film as described herein can include additional water-soluble layers with the vapor-deposited inorganic coatings applied to the surfaces of the outermost layer(s). Generally, multi-layer films can be formed in any suitable way. For example, multi-layer films can be co-extruded as known in the art. Alternatively, multi-layer films can be formed through a lamination or solvent welding process. As can be appreciated, many variations are possible. For example, each layer can be formed from the same polymeric material. The use of a single polymeric material can be useful to minimize compatibility issues between polymers having different characteristics such as different molecular weights. Alternatively, at least one of the layers can be formed of a second polymeric material. As can be appreciated, the second polymeric material can generally be any polymer or co-polymer which can satisfactorily form a film with the polymeric material of the other layers. The second polymeric material can be a water-soluble material such as another PVOH polymer or can be a water-insoluble polymeric material such as polyethylene or ethylene vinyl acetate in certain embodiments. The use of a second water-soluble polymeric material can allow for water-soluble layers, and films, having specific properties to be formed more easily than by blending multiple polymers together within a single water-soluble layer.

In any of the embodiments describing multiple water-soluble layers, the number of layers can vary. For example, the films can include 3 water-soluble layers, 5 water-soluble layers, 7 water-soluble layers, 9 water-soluble layers, or more than 9 water-soluble layers in various embodiments.

The overall thickness of a film including multiple water-soluble layers can generally vary depending on the desired dissolution time and barrier properties. In certain embodiments, the overall thickness of such films can be about 5 micrometers to about 300 micrometers. In certain embodiments, a film having multiple water-soluble layers can have a thickness of about 25 micrometers to about 200 micrometers. In certain embodiments, a film having multiple water-soluble layers can have a thickness of about 50 micrometers to about 100 micrometers.

Additional Components Included in the Water-Soluble Layers

As can be appreciated, any of the water-soluble layers described herein can further include a large number of optional components. For example, water-soluble layers can additionally include one or more plasticizers and gas-barrier additives. When included, such components can be blended with the water-soluble polymeric material before formation of the water-soluble layer.

For example, any of the water-soluble polymeric materials described herein can further include one or more plasticizers to improve the rheological properties of the water-soluble layer. In such embodiments, a plasticizer can improve the flexibility and plasticity of the final film. As can be appreciated, when a plasticizer is included in a water-soluble layer as described herein, the size and mobility of the plasticizer can influence the barrier properties of the film. For example, less mobile plasticizers such as sorbitol can facilitate the formation of water-soluble layers with greater barrier properties than water-soluble layers including a more mobile plasticizer such as glycerin. Suitable plasticizers can include, but are not limited to, glycerin, ethylene glycol, diethylene glycol, hexylene glycol, triethylene glycol, propylene glycol, polyethylene glycol, polypropyl glycol, alkyl citrate, sorbitol, isosorbide, pentaerythritol, glucamine, N-methylglucamine, sodium cumene sulfonate, water, and mixtures thereof. In certain examples, the plasticizer can be glycerin. As can be appreciated, other plasticizers can also be suitable including vegetable oil, polysorbitols, polyethylene oxide, dimethicone, mineral oil, paraffin, $C_1$-$C_3$ alcohols, dimethyl sulfoxide, N,N-dimethylacetamide, sucrose, corn syrup, fructose, dioctyl sodium-sulfosuccinate, triethyl citrate, tributyl citrate, 1,2-propylenglycol, mono, di- or triacetates of glycerin, natural gums, citrates, and mixtures thereof.

In any of the various embodiments including a plasticizer, the plasticizer can be included, by weight of the water-soluble layer, at a level of from about 8% to about 30%, or any integer percentage from about 8% to about 30%, or any range formed by any of the preceding values, such as about 8% to about 25%, about 8% to about 20%, about 10% to about 15%, etc. As can be appreciated, a mixture of multiple plasticizers can also be included in any embodiment including a plasticizer to, for example, tailor the rheological and barrier properties of the water-soluble layer.

In certain embodiments, the plasticizer can be glycerin and can be included at about 1% to about 15% by weight of the water-soluble layer. In other embodiments, the plasticizer can be polyethylene glycol. In certain such embodiments, polyethylene glycol can be included at about 1% to about 7.5%, by weight of the water-soluble layer.

The amount of plasticizer can be verified using techniques known in the art. For example, the amount of glycerin can be determined through use of a gas chromatography with a flame ionization detector ("GC-FID"). In such methods, ethanol can be used to extract glycerin from a small portion of the water-soluble layer or resin. The quantity of glycerin can be determined by comparing to a known commercial glycerin material. As can be appreciated, other processes can be used to determine the quantity of other types of plasticizers including, for example, time of flight mass spectroscopy ("MALDI-TOF MS"), and Raman spectroscopy.

Certain water-soluble layers as described herein can optionally include a gas-barrier additive to further improve the barrier properties of the film. Generally, suitable gas-barrier additives can include any compound, or polymers, compatible with the water-soluble polymeric material which improves the film's barrier properties. For example, suitable gas-barrier additives can include nanoclays, cellulose nano-fibrils, cellulose nano-crystals, talc, graphene, and polymers such as chitin, cellulose, starch, soy, whey, and gluten. An example of a suitable nanoclay is methyl-bis(hydroxyethyl) octadecyl ammonium surface compatibilized montmorillonite clay.

In any of the embodiments including a gas-barrier additive, the gas-barrier additive can be added in any suitable manner. For example, the gas-barrier additive can be blended into the water-soluble polymeric material feed stock and then thoroughly dispersed to exfoliate the additive. When included, a gas-barrier additive can be added at any suitable quantity that does not cause determents to the film. For example, a gas-barrier additive can be included, by weight of the water-soluble layer, at about 0.1% to about 5% in certain embodiments, at about 0.5% to about 4% in certain embodiments, at about 1% to about 3% in certain embodiments, and at about 2% in certain embodiments.

As can be appreciated, the water-soluble layers can still optionally include auxiliary agents and processing agents such as plasticizer compatibilizers, lubricants, release agents, surfactants, fillers, extenders, cross-linking agents, antiblocking agents, antioxidants, detackifying agents, anti-foams, foaming agents, bleaching agents (e.g., sodium metabisulfite or sodium bisulfite), aversive agents such as bitterants (e.g., denatonium benzoate, denatonium saccharide, denatonium chloride, sucrose octaacetate, quinine, flavonoids such as quercetin and naringen, and quassinoids such as quassin and brucine) and pungent agents (e.g., capsaicin, piperine, allyl isothiocyanate, and resinferatoxin) as known in the art. Suitable examples of fillers, extenders, antiblocking agents, wetting agents, and/or detackifying agents can include starches, modified starches, crosslinked polyvinylpyrrolidone, crosslinked cellulose, microcrystalline cellulose, silica, metallic oxides, calcium carbonate, talc and mica.

Suitable lubricants and release agents can include fatty acids and their salts, fatty alcohols, fatty esters, fatty amines, fatty amine acetates, fatty amides, and silicones.

Suitable surfactants for the water-soluble layers for a film described herein can include nonionic, cationic, anionic and zwitterionic surfactants. Specific examples of suitable surfactants can include, but are not limited to, polyoxyethylenatedpolyoxypropylene glycols, alcohol ethoxylates, alkylphenol ethoxylates, tertiary acetylenic glycols and alkanolamides (nonionics), polyoxyethylenated amines, quaternary ammonium salts and quaternized polyoxyethylenated amines (cationics), and amine oxides, N-alkylbetaines and sulfobetaines (zwitterionics). Other suitable surfactants can include dioctyl sodium sulfosuccinate, lactylated fatty acid esters of glycerol and propylene glycol, lactylic esters of fatty acids, sodium alkyl sulfates, polysorbate 20, polysorbate 60, polysorbate 65, polysorbate 80, lecithin, acetylated fatty acid esters of glycerol and propylene glycol, and acetylated esters of fatty acids, and combinations thereof.

In embodiments of a water-soluble layer including an aversive agent such as denatonium benzoate, the aversive agent can be included in suitable quantities to ensure that the aversive effect provides an adequate response without interfering with the properties of the film. For example, denatonium benzoate can be included at about 100 parts-per-million ("ppm") to about 500 ppm.

As can be appreciated, any of the various water-soluble layers for a film described herein can be tailored by including a selection of such optional components. In embodiments wherein the water-soluble layer includes multiple layers, any of the optional components can be included only in certain layers or can be included in each of the layers. For example, in certain embodiments, an aversive agent can be included only in layers likely to be contacted by humans. It can also be useful to include a gas-barrier additive only in inner water-soluble layers. Including the gas-barrier additive in the inner water-soluble layers can minimize any detriments caused by the gas-barrier additive such as the sealing properties of the film. As can be appreciated, certain gas barrier additives may have no effect on sealing properties and can be included in any layer.

Methods of Making a Water-Soluble Layer

Any of the water-soluble layers described herein can be formed through any suitable process including extrusion, solution casting, admixing, co-casting, and welding of the water-soluble polymeric material together with any of the optional components, such as plasticizer. As can be appreciated however, it can be advantageous in certain embodiments to form water-soluble layers using a cast extrusion process or blown extrusion processes.

Extrusion process can provide a number of advantages over alternative processes such as solution casting. For example, extrusion processes can facilitate the inclusion of additional components such as additional resins and gas-barrier additives, and can facilitate the formation of multi-layer films. Extrusion processes can also be used to extrude compositions that phase separate. Further, extrusion processes can offer improvements to both the ease of manufacturing and the cost compared to other processing methods. For example, certain water-soluble polymeric materials can exhibit a relatively large temperature difference between the melting temperature and the decomposition temperature. This difference can facilitate the use of extrusion processes by minimizing product loss to thermal decomposition. Generally, the water-soluble layers for films described herein can be formed using known extrusion processes including cast extrusion processes and blown extrusion processes.

The films described herein can be further modified through unilateral or bilateral film orientation. Generally, any of the films can be orientated through known techniques such as the use of elevated temperature biaxial orientation using a dedicated machine. Bilaterally orientated films can exhibit a variety of improved properties including improved barrier properties.

Film Properties

The films described herein can exhibit a number of beneficial properties including excellent barrier properties and low tack values.

Barrier Properties

The films described herein exhibit improved barrier properties as demonstrated by favorable water vapor transmission rates and oxygen transmission rates as measured by the Water Vapor Transmission Rate Test and the Oxygen Transmission Rate Test.

As used herein, the Water Vapor Transmission Rate Test is a test performed on a Mocon Permatran 100K Permeability Instrument at a controlled temperature of 37.8° C. and using a test gas having 60% relative humidity. The carrier gas was nitrogen having a relative humidity of 0% and run through a filter/drier. Samples were allowed to equilibrate for about 30 minutes prior to testing.

As used herein, the Oxygen Transmission Rate Test indicates that testing was performed at a controlled temperature of 40° C. using 100% oxygen test gas having a relative humidity of 80%. The carrier gas was 100% nitrogen gas. Samples were measured on a Mocon Oxtran Oxygen Permeability Instrument in accordance to ASTM D3985.

Any of the films described herein, including any described in alternative embodiments, can have a water vapor transmission rate measured in accordance to Water Vapor Transmission Rate test of about 1,500 g/(m$^2$·day) to about 6,000 g/(m$^2$·day), or any integer value from about 1,500 g/(m$^2$·day) to about 6,000 g/(m$^2$·day), or any range formed by any of the preceding values such as, about 2,000 g/(m$^2$·day) to about 5,500 g/(m$^2$·day), and 2,5000 g/(m$^2$·day) to about 4,000 g/(m$^2$·day), etc.

Any of the films described herein, including any alternative embodiments, can have oxygen transmission rates measured in accordance to the Oxygen Transmission Rate test of about 4.65 cc/(m$^2$·day) [0.3 cc/(100 in$^2$·day)] to about 46.5 cc/(m$^2$·day) [3 cc/(100 in$^2$·day)] or any integer value from about 4.65 cc/(m$^2$·day) [0.3 cc/(100 in$^2$·day)] to about 46.5 cc/(m$^2$·day) [3.2 cc/(100 in$^2$·day)], or any range formed by any of the preceding values such as, about 7.75 cc/(m$^2$·day) [0.5 cc/(100 in$^2$·day)] to about 38.75 cc/(m$^2$·day) [2.5 cc/(100 in$^2$·day)], about 15.5 cc/(m$^2$·day) [1 cc/(100 in$^2$·day)] to about 23.25 cc/(m$^2$·day) [1.5 cc/(100 in$^2$·day)], etc. As can be appreciated, such oxygen and water vapor transmission rates can be substantially lower than known PVOH films.

As can be further appreciated, the films described herein can also demonstrate reduced transmission and migration rates for other compounds such as compounds contained within a package formed of the described films or compounds contained with the film. For example, the films can exhibit improved resistance to the migration of optical dyes, surfactants, and perfumes contained within a unit dose article. Additionally, compounds such as bittering agents contained within the film can be resistant to migration out of the film.

As can be appreciated, improving the barrier properties of a film can cause articles formed from the films to exhibit a number of beneficial improvements. For example, reduced oxygen migration can improve the stability of compositions contained with the articles.

Other benefits are also possible. For example, improved barrier properties can prevent migration of chemicals into, or out of, packages formed from the films described herein. Such properties can improve the lifespan of the packaging or prevent "weeping" or tacky feel as chemicals migrate out of the packaging.

Tack Properties

The films described herein can also exhibit reduced tack compared to uncoated water-soluble films. For example, the films described herein can exhibit a tack force of about 5,000 N or less when measured in accordance to the Tack Force method. An uncoated polyvinyl alcohol film can have a tack force of more than 30,000 N.

In the Tack Force method, two samples of a film are cut and mounted to a texture analyzer (Texture Analyzer XT Plus by Texture Technologies (Hamilton, Mass.)) using 5 cm×5 cm pieces of double-sided tape. The top sample is 5 cm×6 cm in size. The bottom sample is 7 cm×10 cm in size. The samples are evaluated at a temperature of 22° C. and 35% relative humidity using a 50 kg load cell with a contact time of 2 seconds. Prior to measurement of the tack force, the sample are sprayed with water at 0.2 bar of pressure from a distance of 110 mm and allowed to relax for 10 seconds.

Method for Measuring Microfractures

A scanning electron microscope (SEM) is used to observe the surface of the uncoated film and the microfractures in the inorganic coating. The SEM images of 1000 nm $Al_2O_3$ before and after stretching are taken with a Hitachi TM3000 Bench-top SEM. For cases that need higher magnification, as for $Al_2O_3$ coatings, a FEI XL-30 ESEM is used. Where samples were stretched, they were stretched using an Instron machine. In order to stretch films, an Instron 5948 MicroTester is used. If a sample is stretched from 1 cm to 2.5 cm, we say that it is stretched to 150% of its original length.

Method for Measuring Coating Thickness During Coating Process

In order to monitor the thickness of inorganic coatings, an INFICON XTC/3 Thin Film Deposition Controller is used in situ (within the vacuum chamber) during deposition.

Method for Measuring Coating Thickness and Chemical Analysis of Coated Film

In order to measure the thickness of a coating on a film (or even to determine if there is a coating present on a film), high resolution Scanning Electron Microscopy (SEM) can be used. In order to prepare a sample for thickness measurements using high resolution SEM, the sample is cut in half in order to obtain a cross-section using a microtome, preferably a cryogenic microtome in order to get the best cut without smearing the surface to be examined. This assumes that the film is already separated from other elements of a product. However, if the film is part of a commercial consumer product e.g. such as a fabric care unit dose pod product, then a small part of the film is first cut from the product and cleaned. Cleaning can be achieved by carefully wiping any liquid product off the inside of the film that had been directly in contact with the product. Dust and dirt from particles can be removed from the other surface using an air gun. The sample is then placed on a vertical stub using double sided carbon tape to hold the sample in place. The sample can be sputter coated with Au—Pd prior to SEM analysis, to ensure a good image. The cross-sectional area of the sample is examined to determine if a coating is present on either of the film surfaces. If present, the thickness of the coating is determined by the scale on the SEM.

To determine the chemical composition of the coating, EDAX (typically attached to an SEM) can be used in order to determine the chemical composition of inorganic coatings. In addition, XPS can also be used to identify the chemical identity of inorganic coatings.

A sample for chemical identification is prepared by cutting a small fragment from the finished product and clean it as described previously. If EDAX is being used, the sample is placed on a stub with double sided carbon tape (the samples would not be coated with Au—Pd for EDAX analysis). For XPS analysis, the sample is placed on a silicon wafer, anchoring the sample with carbon tape (or any other vacuum compatible tape) at the corners.

Dissolution Test Method

The Dissolution Test Method for a water-soluble film measures the total time (in seconds) for complete dissolution of a particular film specimen when the test is performed according to Slide Dissolution Test, which is MONOSOL Test Method 205 (MSTM 205), as set forth in paragraphs 116-131 of US published patent application US201500935210A1, entitled "Water-soluble film having improved dissolution and stress properties, and packets made therefrom," the entire publication is hereby incorporated by reference; the Dissolution Test Method used herein is the same as that set forth in US201500935210A1, except that in the Dissolution Test Method of the present disclosure, instead of maintaining the distilled water at 10° C., the distilled water is maintained at 15° C. While the standard version of the Dissolution Test Method uses distilled water maintained at 15° C., the Dissolution Test Method may be run in modified form with the distilled water maintained at another specified temperature, in order to provide further comparative data at a different temperature. The Dissolution Test Method does not apply to any materials other than water-soluble films having an overall thickness less than or equal to 3 millimeters.

Other Testing Requirements

When testing and/or measuring a material, if the relevant test method does not specify a particular temperature, then the testing and/or measuring is performed on specimens at a temperature of 22° C. (+/−3° C.) (with such specimens preconditioned to that temperature). When testing and/or measuring a material, if the relevant test method does not specify a particular humidity, then the testing and/or measuring is performed on specimens at a relative humidity of 35% (+/−5%) (with such specimens preconditioned to that humidity). All tools and/or instruments for testing and/or measuring must be properly calibrated before the testing and/or measuring. All testing and/or measuring should be conducted by trained, skilled, and experienced technologists. All testing and/or measuring should be conducted according to good laboratory practices, with the goal of obtaining accurate results.

Articles

In certain embodiments, some, or all, of the films described herein can be used to form unit dose articles, such as soluble unit dose articles. Soluble unit dose articles are packages containing a pre-measured quantity of one or more compositions, such as detergents. The compositions can be included in a compartment formed by sealing one or more films together. As can be appreciated, soluble unit dose articles provide convenient dispensing of compositions for applications such as laundry and dishwashing.

As can be appreciated, other articles can alternatively be formed from the films described herein. For example, packaging for water-softening compositions, medical compositions, health care compositions, nutraceuticals compositions, shaving compositions, personal cleansing compositions, hard surface cleaning cleansing compositions, natural cleaning products containing bacteria/microbes, pharmaceutical compositions, dental care compositions, beauty care compositions, disinfectant compositions, antibacterial compositions, antiseptic compositions, food, herbs, flavours, and aids or supplements thereof can be formed in various embodiments. Additional details of various possible articles are disclosed in U.S. Patent App. 2002/0150708 and U.S. Patent App. 2009/0250370. Additionally, the films can be useful for the formation of soluble laundry bags including those described in U.S. Patent App. No. 2002/0150708.

In certain embodiments, dry or low water content articles could be packaged in these films—for example durable or semi-durable items such as razors, toothbrushes, in addition to single use articles such as tampons, diapers and other sanitary protection items. As can be appreciated, the exterior surfaces of such articles will have delayed dissolution before the package starts to dissolve. In other embodiments, the films could be used for packaging of single or multiple use powder based products such as those used for laundry or personal cleaning.

Process for Making an Article

Generally, the process of making an article, such as a unit dose article, can include the steps of forming an open pouch, filling the open pouch with a composition, and closing the open pouch filled with the composition. The open pouch can be formed by placing a film into a mold. The pouch can be closed with a second film. As can be appreciated, one or more of the films used to form the article can be the films as described herein. Other articles can be made as known in the art.

As can be further appreciated, vapor-deposited inorganic coatings as described herein can alternatively be formed on completed articles. In such embodiments, a completed article, such as a unit dose article, can undergo processes similar to the processes used to form vapor-deposited inorganic coatings on the film described herein. For example, a plasma-assisted chemical vapor deposition process can be used to form a vapor-deposited inorganic coating on the outside surface of a unit dose article formed from uncoated PVOH polymer films.

In any embodiment described herein, articles can be formed in a web process which forms multiple articles at once. After the web is sealed, the web can be cut to form individual articles.

Articles described herein can be made by thermoforming, vacuum-forming or a combination thereof. Articles can be sealed using any sealing method known in the art. Suitable sealing methods can include heat sealing, solvent sealing, pressure sealing, ultrasonic sealing, pressure sealing, laser sealing, impulse sealing, infrared ("IR") sealing, or a combination thereof. For example, water or another suitable aqueous solvent can be applied to an edge to partially dissolve the film allowing a seal to be formed.

In certain examples, an article can also be dusted with a dusting agent, such as talc, silica, zeolite, carbonate, or a mixture thereof to prevent film blocking. As can be appreciated however, the necessity of such dusting agents can be eliminated by the non-tacky nature of the vapor-deposited inorganic coating.

In certain examples, a package may be formed by a simple form, fill, seal process as used to form packaging sachets and pouches today. Examples of such a process are given in Packaging Digest, such as those described at http://www.packagingdigest.com/form-fill-seal or https://viking-masek.com/packaging-machine-resources/packaging-machine-blog/a-guide-to-vertical-form-fill-seal-machines.

FIGS. 7A-11D illustrate various embodiments of exemplary soluble unit dose articles; in these figures, flexible materials are illustrated with exaggerated thicknesses in order to more clearly show their positions and relationships.

FIGS. 7A-7D illustrate various views of an exemplary soluble unit dose article 300 having a flat top 301, a rounded bottom 302, and one compartment 331. FIG. 7A is a top view, FIG. 7B is a side view, FIG. 7C is an end view, and FIG. 7D is a cross-sectional end view. In the top view, the overall shape of the article 300 is rectangular with rounded corners. The article 300 is formed by a first flexible material 311 that is sealed to a second flexible material 312 over a sealed area 321. The sealed area 321 forms a continuous connection between the flexible materials 311 and 312, all around the outer periphery of the article 300. Apart from the sealed area 321, the flexible materials 311 and 312 are independent from each other. The first flexible material 311 is disposed above the second flexible material 312, and is oriented about horizontally. On the bottom 302, in the middle of the article 300, the second flexible material 312 curves downward from the sealed area 321 and is offset from the first flexible material 311, such that the space between the flexible materials 311 and 312 forms the compartment 331, which has a side profile with an overall shape like an inverted bell. The compartment 331 surrounds and encloses a composition 341.

FIGS. 8A-8D illustrate various views of an exemplary soluble unit dose article 400 having a rounded top 401, a rounded bottom 402, and one compartment 431. FIG. 8A is a top view, FIG. 8B is a side view, FIG. 8C is an end view, and FIG. 8D is a cross-sectional end view. In the top view, the overall shape of the article 400 is rectangular with rounded corners. The article 400 is formed by a first flexible material 412 that is sealed to a second flexible material 413 over a sealed area 421. The sealed area 421 forms a continuous connection between the flexible materials 412 and 413, all around the outer periphery of the article 400. Apart from the sealed area 421, the flexible materials 411 and 412 are independent from each other. On the bottom 402, in the middle of the article 400, the first flexible material 412 curves downward from the sealed area 421, and on the top 401, in the middle of the article 400, the second flexible material 413 curves upward from the sealed area 421 such that the second flexible material 413 is offset from the first flexible material 412, and the space between the flexible materials 412 and 413 forms the compartment 431, which has a side profile with an overall shape like a pillow. The compartment 431 surrounds and encloses a composition 441.

FIGS. 9A-9D illustrate various views of an exemplary soluble unit dose article 500 having a rounded top 501, a rounded bottom 502, and two overlapping compartments 531 and 532. FIG. 9A is a top view, FIG. 9B is a side view, FIG. 9C is an end view, and FIG. 9D is a cross-sectional end view. In the top view, the overall shape of the article 500 is rectangular with rounded corners. The article 500 is formed by a first flexible material 511, a second flexible material 512, and a third flexible material 513, which are all sealed together over a sealed area 521. The sealed area 521 forms a continuous connection between the flexible materials 511, 512, and 513, all around the outer periphery of the article 500. Apart from the sealed area 521, the flexible materials 511, 512, and 513 are independent from each other. The first flexible material 511 is disposed between the second flexible material 512 and the third flexible material 513, and is oriented about horizontally. On the bottom 502, in the middle of the article 500, the second flexible material 512 curves downward from the sealed area 521 such that the second flexible material 512 is offset from the first flexible material 511, and the space between the flexible materials 511 and 512 forms the first compartment 531, which has a side profile with an overall shape like an inverted bell. The first compartment 531 surrounds and encloses a first composition 541. On the top 501, in the middle of the article 500, the third flexible material 513 curves upward from the sealed area 521 such that the third flexible material 513 is offset from the first flexible material 511, and the space between the flexible materials 512 and 513 forms the second compartment 532, which has a side profile with an overall shape like a bell. The second compartment 532 surrounds and encloses a second composition 542. The article 500 has a side profile with an overall shape like a pillow.

FIGS. 10A-10D illustrate various views of an exemplary soluble unit dose article 600 having a rounded top 601, a flat bottom 602, and two side-by-side compartments 633 and 634. FIG. 10A is a top view, FIG. 10B is a side view, FIG. 10C is an end view, and FIG. 10D is a cross-sectional end view. In the top view, the overall shape of the article 600 is rectangular with rounded corners. The article 600 is formed by a first flexible material 611 that is sealed to a second flexible material 613 over a sealed area 621. The sealed area 621 forms a continuous connection between the flexible materials 611 and 613, all around the outer periphery of the article 600 and through a portion of the middle of the article 600. Apart from the sealed area 621, the flexible materials 611 and 613 are independent from each other. The first flexible material 611 is disposed below the second flexible material 613, and is oriented about horizontally. On the top 601, in a first part of the middle of the article 600, a first portion of the second flexible material 613 curves upward from the sealed area 621 such that that first portion of the second flexible material 613 is offset from the first flexible material 611, and the space between the flexible materials 611 and 613 forms the first compartment 633, which has a side profile with an overall shape like a rounded tube. The first compartment 633 surrounds and encloses a first composition 643. On the top 601, in a second part of the middle of the article 600, a second portion of the second flexible material 613 curves upward from the sealed area 621 such that that second portion of the second flexible material 613 is offset from the first flexible material 611, and the space between the flexible materials 611 and 613 forms the second compartment 634, which has a side profile with an overall shape like a rounded tube. The second compartment 634 surrounds and encloses a second composition 644, which differs from the first composition 643.

Figure 11A:
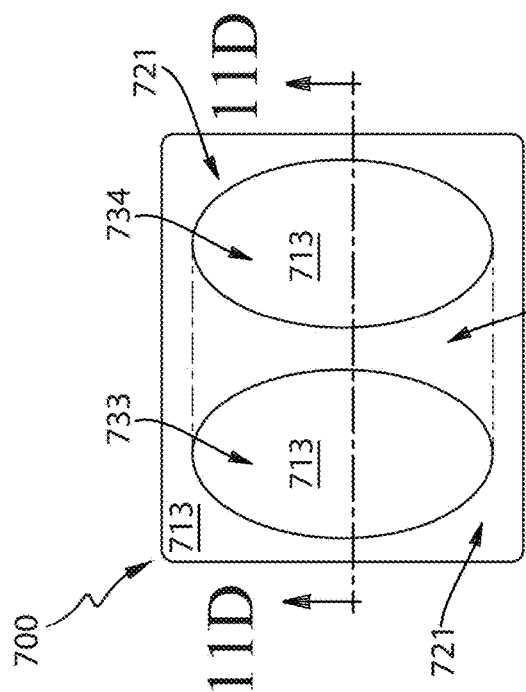
FIG. 11A illustrates soluble unit dose article having a rounded top, a rounded bottom, and two smaller side-by-side compartments each overlapping a larger bottom compartment according to one example.
Figure 11B:
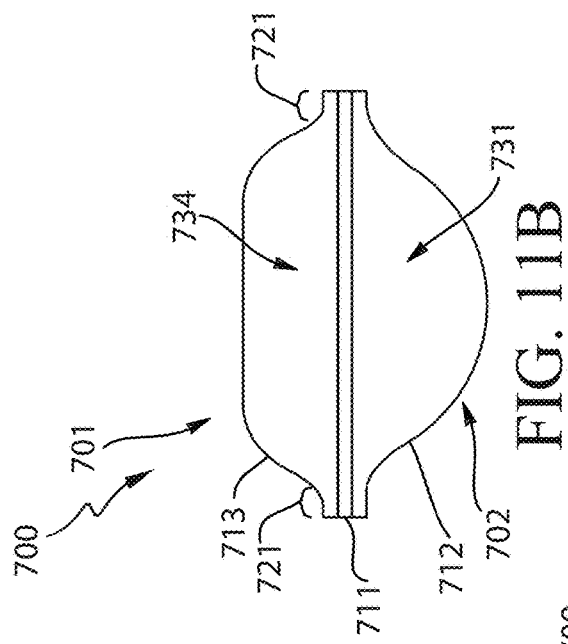
FIG. 11B illustrates a side view of the unit dose article of FIG. 11A.
Figure 11C:
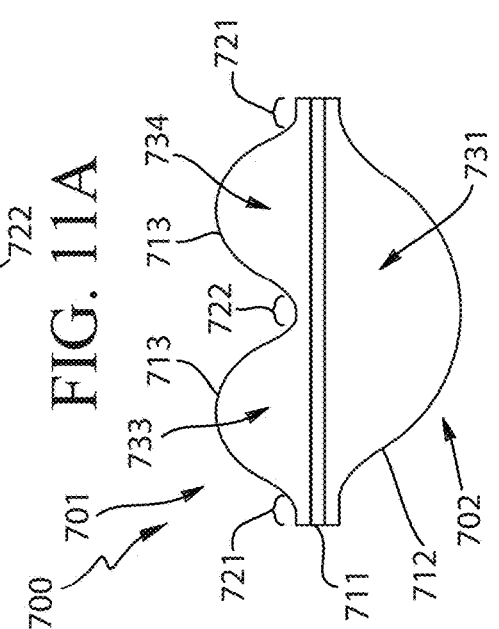
FIG. 11C illustrates an end view of the unit dose article of FIG. 11A.
Figure 11D:
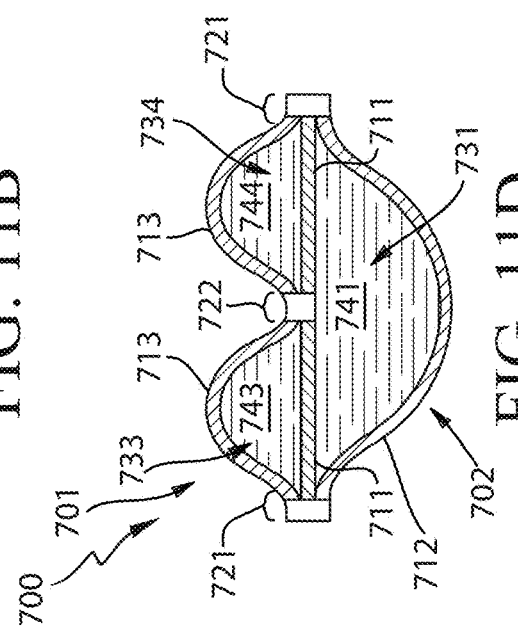
FIG. 11D illustrates a cross-sectional end view of the unit dose article of FIG. 11A.

FIGS. 11A-11D illustrate various views of an exemplary soluble unit dose article 700 having a rounded top 701, a rounded bottom 702, and two smaller side-by-side compartments 733 and 734 each overlapping a larger bottom compartment 731. FIG. 11A is a top view, FIG. 11B is a side view, FIG. 11C is an end view, and FIG. 11D is a cross-sectional end view. In the top view, the overall shape of the article 700 is rectangular with rounded corners. The article 700 is formed by a first flexible material 711, a second flexible material 712, and a third flexible material 713, which are sealed together over a first sealed area 721 and a second sealed area 722, as described below. The first sealed area 721 forms a continuous connection between the flexible materials 711, 712, and 713, all around the outer periphery of the article 700. The second sealed area 722 forms a continuous connection between the first flexible material 711 and the third flexible material 713, through a portion of the middle of the article 700, between the compartments 733 and 734 (as shown, bounded by the reference lines). Apart from the sealed areas 721 and 722, the flexible materials 711, 712, and 713 are independent from each other. The first flexible material 711 is disposed between the second flexible material 712 and the third flexible material 713, and is oriented about horizontally. On the bottom 702, in the middle of the article 700, the second flexible material 712 curves downward from the sealed area 721 such that the second flexible material 712 is offset from the first flexible material 711, and the space between the flexible materials 711 and 712 forms the larger compartment 731, which has a side profile with an overall shape like an inverted bell. The compartment 731 surrounds and encloses a first composition 741. On the top 701, in a first part of the middle of the article 700, a first portion of the third flexible material 713 curves upward from the sealed areas 721 and 722 such that that first portion of the second flexible material 713 is offset from the first flexible material 711, and the space between the flexible materials 711 and 713 forms the first smaller compartment 733, which has a side profile with an overall shape like a rounded tube. The compartment 733 surrounds and encloses a second composition 743, which differs from the first composition 741. On the top 701, in a second part of the middle of the article 700, a second portion of the second flexible material 713 curves upward from the sealed areas 721 and 722 such that that second portion of the second flexible material 713 is offset from the first flexible material 711, and the space between the flexible materials 711 and 713 forms the second smaller compartment 734, which has a side profile with an overall shape like a rounded tube. The compartment 734 surrounds and encloses a third composition 744, which differs from both the first composition 741 and the second composition 743.

Part, parts, or all of any of the soluble unit dose article embodiments of FIGS. 7A-11D can be made, used, and/or modified in any way known in the art. For example, any of these articles can be configured with any convenient size and shape along with any number of compartments, as described herein and/or as known in the art; as examples, a soluble unit dose article can be configured according to any embodiment disclosed in U.S. Pat. No. 9,725,685 entitled "Unit Dose Article," which is hereby incorporated by reference, or any commercially available embodiment of a soluble unit dose article (e.g. TIDE PODS and CASCADE ACTION PACS made by The Procter & Gamble Company, of Cincinnati, Ohio, United States of America). Any of the compartments for these articles can be configured with any convenient size, shape, configuration, and relationship, as described herein and/or as known in the art. Any of the compartments for these articles can be filled with one or more of any composition(s) described herein and/or known in the art of soluble unit dose articles; as examples, such compositions can include on or more of any of the following: fabric care compositions (detergents, surfactants, bleaches, fabric softeners, dyes, brighteners, perfumes, etc.), dish care compositions, agrochemicals, water treatment chemicals, dyes, etc. Any of the compositions disclosed herein can take any convenient form disclosed herein or known in the art, such as: liquid, paste, solid, fibrous, granular, powdered, etc. Any of the flexible materials used to form these articles can be the same material, or different versions of the same material, or different materials, as described herein and/or as known in the art; for example, any of the water soluble films disclosed herein can be used (by itself and/or as part of a laminate/composite material) for part, parts, or all of any of these flexible materials. And, any of the water soluble films disclosed herein can be used (by itself and/or as part of a laminate/composite material) to form part, parts, or all of a soluble unit dose article known in the art, and can include any additives and/or coatings (e.g. bitterants, gas-barrier additives, etc), known in the art of soluble unit dose articles. Part, parts, or all of any of these aspects can be combined together in any workable manner to form further alternative embodiments. Further, any of the water soluble films disclosed herein can be used (by itself and/or as part of a laminate/composite material) to form part, parts, or all of components in health and hygiene products, such as disposable diapers and training pants, incontinence articles, and feminine care products (e.g., pads and liners), in medical products such as bags for bodily fluids and/or waste (e.g., ostomy pouches), and in other household products such as trash bags, laundry bags, hamper liners, etc. Water-soluble films also can be used to form embroidery products, beauty products (e.g. face masks that include water soluble components), personal care products, shaving products, health care products, pharmaceuticals, etc. Still further, any of the water soluble films disclosed herein can be used (by itself and/or as part of a laminate/composite material) to form part, parts, or all of a flexible package (e.g. sachet), in order to provide for improved disposability for the package; such packages can have any convenient size and may include any number of doses (e.g. single dose, multiple dose, etc.). Any of the films described herein can be used as part, parts, or all of a primary package, and/or a secondary package, and/or any other kind of package or packaging material known in the art.

EXAMPLES

Table 1 depicts water vapor transmission rates and oxygen transmission rates of several films including a water-soluble layer and a vapor-deposited inorganic coating joined to the water-soluble layer. Each film had an overall thickness of 76 microns. Certain Examples further included ablation of the water-soluble layer prior to application of the vapor-deposited inorganic coating.

Water vapor transmission rates and oxygen transmission rates depicted in Table 1 were measured in accordance to the Water Vapor Transmission Rate Test and the Oxygen Transmission Rate Test previously described.

TABLE 1

| Examples | Water Vapor Transmission Rate (g/ ($m^2 \cdot$ day)) | Oxygen Transmission Rate (cc/ ($m^2 \cdot$ day) [cc/ (100 $in^2 \cdot$ day)] |
| --- | --- | --- |
| Comparative Example 1 - Uncoated PVOH Layer | 4,792 (Avg. of 2 samples) | 16.31 [1.052] |
| Inventive Ex. 2 - Ex. 1 + 10 nm SiOC | 4608 | 19.38 [1.25] |

TABLE 1-continued

| Examples | Water Vapor Transmission Rate (g/ (m² · day)) | Oxygen Transmission Rate (cc/ (m² · day)) [cc/ (100 in² · day)] |
|---|---|---|
| Inventive Ex. 3 - Ex. 1 + 100 nm SiOC (Both sides) | 4410 | — |
| Inventive Ex. 4 - Ex. 1 + 10 nm Al₂O₃ | 4520 | — |
| Inventive Ex. 5 - Ex. 1 + 10 nm SiO$_x$ | 4091 | 13.61 [0.878] |
| Inventive Ex. 6 - Ex. 1 + 2X (100 nm SiO$_x$) (Both sides) | 4856 | 15.97 [1.03] |
| Inventive Ex. 7 - Ex. 1 + 100 nm Al₂O₃ | 3738 | — |
| Inventive Ex. 8 - Ex. 1 + 200 nm Al₂O₃ | 3132 | — |
| Inventive Ex. 9 - Ex. 1 + 200 nm Al₂O₃ + SiN$_x$ (5*25) | 3884 | — |
| Inventive Ex. 9 - Ex. 1 + 300 nm Al₂O₃ | 2872 | — |
| Inventive Ex. 10 - Ex. 1 + 500 nm Al₂O₃ | 2743 | — |
| Inventive Ex. 11 - Ex. 1 + 1000 nm Al₂O₃ | 2685 | — |
| Inventive Ex. 12 - Ex. 1 + 2X(100 nm Al₂O₃) (Both sides) | 4372 | — |
| Inventive Ex. 13 - Ex. 1 + 140 W SiO$_x$ | 5168 | — |
| Inventive Ex. 14 - Ex. 1 + 140 W SiO$_x$ + 100 nm Al₂O₃ | 4383 | — |
| Inventive Ex. 15 - Ex. 1 + 140 W SiO$_x$ + 500 nm Al₂O₃ | 3841 | — |
| Inventive Ex. 16 - Ex. 1 + 140 W SiO$_x$ + 1000 nm Al₂O₃ | 3918 | — |
| Inventive Ex. 17 - Ex. 1 + 200 nm Mg + SiN$_x$ (5*25) | 3901 | — |

As illustrated by Table 1, films including a vapor-deposited inorganic coating described by the Inventive Examples exhibited improved water vapor transmission rates when compared to the Comparative Examples. Additionally, Inventive Examples 5 and 6 demonstrated improved oxygen transmission rates.

Inventive Examples 7 and 11 from Table 1 were also evaluated for tack strength in accordance with the Tack Method previously described. Inventive Example 7 had a tack strength of 4,407 N and Inventive Example 11 had a tack strength of 61 N. The uncoated film described in Comparative Example 1 had a tack strength of greater than 30,000 N.

Table 2 depicts the water vapor transmission rate and oxygen transmission rate of films including a water soluble layer formed from a different PVOH polymer.

TABLE 2

| Examples | Water Vapor Transmission Rate (g/ (m² · day)) | Oxygen Transmission Rate (cc/ (m² · day)) [cc/ (100 in² · day)] |
|---|---|---|
| Comparative Example 18 - Uncoated PVOH Layer | 5,281 (Avg. of 2 samples) | 4.34 [0.28] |
| Inventive Example 19 - Ex. 18 + 10 nm SiOC | 6,655 | 4.19 [0.27] |
| Inventive Example 20 - Ex. 18 + 10 nm SiO$_x$ | 4,691 | 3.26 [0.21] |
| Inventive Example 21 - Ex. 18 + 10 nm SiN$_x$ | 4,820 | — |
| Inventive Example 22 - Ex. 18 + 10 nm Al₂O$_x$ | 4,967 | 3.26 [0.21] |

As illustrated in Table 2, each Inventive film including a vapor-deposited inorganic coating demonstrated reduced water vapor and oxygen transmission rates compared to the uncoated film of Comparative Example 18.

A PVOH film, Inventive Example 23, was also coated with a 1,000 nm aluminum oxide film and evaluated for oxygen transmission in accordance to ASTM D-3985 and F-1927. Testing was performed at a temperature of 40° C. on a film sample having a thickness of 76 μm. In testing, the test gas was 100% oxygen having a relative humidity of 80%. The carrier gas was 98% nitrogen gas and 2% hydrogen gas. Testing was performed on a Mocon Oxtran 2/21 Oxygen Permeability Instrument. Inventive Example 23 had an oxygen transmission rate of 210.8 cc/(m²·day) [13.6 cc/(100 in²·day)]. The uncoated control, Comparative Example 1, had an oxygen transmission rate of 324.0 cc/(m²·day) [20.9 cc/(100 in²·day)] when measured in accordance with ASTM D-3985 and F-1927.

Unit dose articles were also manufactured and evaluated using the films described herein.

Table 3 depicts the film constructions and separation force of several example unit dose articles. Separation force was determined by clamping the example unit dose article in a bottom test clamp and a unit dose article with no vapor-deposited coating in an upper test clamp. A water nozzle was then used to spray the example unit dose article with water for 2 seconds. The upper unit dose article was then lowered to contact the example unit dose article. The unit dose articles were held together for 10 minutes with 150 grams of force. After 10 minutes, the unit dose articles were separated at 33.33 mm/s and the force required to separate the unit dose articles was measured. Comparative Example 24 was measured in two different sets of test runs.

TABLE 3

| Example No. | Film Construction | Separation Force (g) |
|---|---|---|
| Comparative Example 24 | Uncoated PVOH | 779 ± 88; 414 ± 186 |
| Inventive Example 25 | Ex. 24 + 100 nm Al₂O₃ | 236 ± 59 |
| Inventive Example 26 | Ex. 24 + 100 nm Al₂O₃ (Dull side) | 400 ± 159 |
| Inventive Example 27 | Ex. 24 + 100 nm Al₂O₃ | 725 ± 240 |

As depicted in Table 3, unit dose articles formed with films having a vapor-deposited inorganic coating show large reductions in separation force when compared to unit dose articles formed from films without a vapor-deposited coating.

Table 4 depicts the time required for an example unit dose article to rupture when submerged in distilled water having a temperature of 21.1° C. (20.0° C. for Examples 32 and 33). Each example unit dose article was formed from two PVOH films as described in Table 4. The example unit dose articles were submerged to a depth of 1 cm in water and observed until a sealed juice was observed to leak out. A mirror was placed underneath the example unit dose article to assist in observation of the burst time. This test is referred to as the Soluble Unit Dose Burst test.

TABLE 4

| Example No. | Film Construction | Rupture Time (seconds) |
|---|---|---|
| Comparative Example 28 | Uncoated PVOH | 8 |
| Inventive Example 29 | Ex. 28 + 1,000 nm $Al_2O_3$ | 350 |
| Inventive Example 30 | Ex. 28 + 1,000 nm $Al_2O_3$ | 345 |
| Inventive Example 31 | Ex. 28 + 1,000 nm $Al_2O_3$ | 290 |
| Inventive Example 32 | Ex. 28 + 1,000 nm $Al_2O_3$ | 251 |
| Inventive Example 33 | Ex. 28 + 1,000 nm $Al_2O_3$ | Leaked prior to start of test |

As depicted in Table 4, example soluble unit dose articles formed from films including a vapor-deposited inorganic coating exhibited longer rupture times than a comparative unit dose article formed from films without a vapor-deposited inorganic coating.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments and examples of the present disclosure have been illustrated and described, it would be obvious to those skilled in the art that various other changes and modifications can be made without departing from the spirit and scope of the invention. It is therefore intended to cover in the appended claims all such changes and modifications that are within the scope of this invention.

EXAMPLES/COMBINATIONS

A1. A film comprising:
a layer of water-soluble polymeric material; and
a first vapor-deposited inorganic coating joined to at least one surface of the layer of water-soluble polymeric material, wherein the first vapor-deposited inorganic coating comprises a metal oxide; and
wherein the first vapor-deposited inorganic coating defines a plurality of microfractures extending along the surface of the inorganic coating.

A2. The film of paragraph A1, wherein each of the plurality of microfractures having a length from about 5 microns to about 50 microns.

A3. The film of paragraph A1 or paragraph A2, wherein each of the plurality of microfractures having a width of about 1 micron or less.

A4. The film of any of paragraphs A1 to A3, wherein the first vapor-deposited inorganic coating comprises a plurality of discrete regions bounded by the plurality of microfractures.

A5. The film of paragraph A4, wherein each of the plurality of discrete regions having a length of about 100 microns or less.

A6. The film of paragraph A4 or paragraph A5, wherein greater than 50% of the plurality of discrete regions has a length of about 35 microns or less.

A7. The film of any of paragraphs A4 to A6, wherein each of the plurality of discrete regions having a width of about 100 microns or less.

A8. The film of any of paragraphs A4 to A7, wherein greater than 50% of the plurality of discrete regions has a width of about 35 microns or less.

A9. The film of any of paragraphs A1 to A8, wherein one or more of the plurality of microfractures extends through the entire thickness of the first vapor-deposited inorganic coating.

A10. The film of any of paragraphs 1 to 9, wherein each of the plurality of microfractures extends through the entire thickness of the first vapor-deposited inorganic coating.

A11. The film of any of paragraphs A1 to A8, wherein each of the plurality of microfractures extends only partially through the thickness of the first vapor-deposited inorganic coating.

A12. The film of any of paragraphs A1 to A11, wherein the plurality of microfractures are formed from mechanical treatment of the film.

A13. The film of paragraph A12, wherein the mechanical treatment comprises stretching.

A14. The film of paragraph A12, wherein the mechanical treatment comprises bending.

A15. The film of paragraph A12, wherein the mechanical treatment comprises an out-of-plane deformation.

A16. The film of any of paragraphs A1 to A15, wherein the first vapor-deposited inorganic coating substantially consists of the metal oxide.

A17. The film of any of paragraphs A1 to A15, wherein the first vapor-deposited inorganic coating consists of the metal oxide.

A18. The film of any of paragraphs A1 to A17, wherein the metal oxide comprises one or more of aluminum oxide, silicon oxide, magnesium oxide, and titanium oxide.

A19. The film of any of paragraphs A1 to A18, wherein the first vapor-deposited inorganic coating is directly applied to the at least one surface of the layer of water-soluble polymeric material.

A20. The film of any of paragraphs A1 to A19, wherein the first vapor-deposited inorganic coating has a thickness of about 2 nanometers to about 1,000 nanometers.

A21. The film of any of paragraphs A1 to A20, wherein the first vapor-deposited inorganic coating has a thickness of about 50 nanometers to about 300 nanometers.

A22. The film of any of paragraphs A1 to A20, wherein the first vapor-deposited inorganic coating has a thickness of about 300 nanometers to about 1,000 nanometers.

A23. The film of any of paragraphs A1 to A22 has a thickness of about 5 microns to about 300 microns.

A24. The film of any of paragraphs A1 to A23 comprising a plurality of layers of water-soluble polymeric material.

A25. The film of any of paragraphs A1 to A24, wherein the layer of water-soluble polymeric material is solution cast.

A26. The film of any of paragraphs A1 to A24, wherein the layer of water-soluble polymeric material is extruded.

A27. The film of any of paragraphs A1 to A26, wherein the layer of water-soluble polymeric material comprises one or more of polyvinyl alcohol, a copolymer of vinyl alcohol and butene-diol, polyethylene glycol, and polyethylene oxide.

A28. The film of any of paragraphs A1 to A27, wherein the layer of water-soluble polymeric material consists essentially of polyvinyl alcohol.

A29. The film of any of paragraphs A1 to A28, wherein the layer of water-soluble polymeric material further comprises one or more plasticizers, gas-barrier additives, and bittering agents.

A30. The film of any of paragraphs A1 to A29, wherein the first vapor-deposited inorganic coating has a thickness of about 100 nanometers to about 500 nanometers; and wherein the film has a thickness of about 76 microns and exhibits a water vapor transmission rate of about 2,000 g/(m²·day) to about 5,500 g/(m²·day) when measured in accordance to the Water Vapor Transmission Rate Test method.

A31. The film of any of paragraphs A1 to A30, wherein the first vapor-deposited inorganic coating has a thickness of about 100 nanometers to about 500 nanometers; and wherein the film has a thickness of about 76 microns and exhibits an oxygen transmission rate of about 8 cc/(m²·day) [0.5 cc/(100 in²·day)] to about 30 cc/(m²·day) [2.5 cc/(100 in²·day)] when measured in accordance to the Oxygen Transmission Rate Test method.

A32. The film of any of paragraphs A1 to A31 further comprising a second vapor-deposited inorganic coating.

A33. The film of paragraph A32, wherein the second vapor-deposited inorganic coating is joined to the first vapor-deposited inorganic coating.

A34. The film of paragraph A32, wherein the second vapor-deposited inorganic coating is joined to a different surface of the layer of water-soluble polymeric material.

A35. The film of any of paragraphs A32 to A34, wherein the second vapor-deposited inorganic coating comprises a metal oxide comprising one or more of aluminum oxide, silicon oxide, magnesium oxide, and titanium oxide.

A36. The film of any of paragraphs A1 to A35 exhibits a tack force of about 5,000 N or less when measured in accordance to the Tack Force method.

A37. The film of any of paragraphs 1 to 36, wherein the first vapor-deposited inorganic coating is formed by a plasma-assisted deposition process.

A38. The film of any of paragraphs A1 to A37, wherein the first vapor-deposited inorganic coating is joined to only one surface of the layer formed of the water-soluble polymeric material.

A39. The film of any of paragraphs A1 to A38, wherein the at least one surface of the layer of water-soluble polymeric material is at least partially ablated.

A40. The film of any of paragraphs A1 to A39, wherein the at least one surface of the layer of water-soluble polymeric material is substantially fully ablated.

A41. The film of paragraph A39 or paragraph A40, wherein the layer of water-soluble polymeric material is ablated with one or more of a plasma treatment, a solvent treatment, a flame treatment, a photon ablation treatment, an electron beam irradiation treatment, an ion bombardment treatment, an ultraviolet treatment, a vacuum annealing treatment, or a physical abrasion treatment.

A42. The film of any of paragraphs A39 to A41, wherein the layer of water-soluble polymeric material is ablated with a helium-oxygen plasma or an argon-oxygen plasma.

B. A film comprising:
  a layer of water-soluble polyvinyl alcohol; and
  a vapor-deposited inorganic coating joined to at least one surface of the layer of water-soluble polyvinyl alcohol, wherein the first vapor-deposited inorganic coating comprises a metal oxide and has a thickness of about 100 nanometers to about 500 nanometers; and
  wherein the vapor-deposited inorganic coating defines a plurality of microfractures extending along the surface of the inorganic coating, each of the plurality of microfractures having a length from about 5 microns to about 50 microns; and
  wherein the film has a thickness of about 76 microns and exhibits a water vapor transmission rate of about 2,000 g/(m²·day) to about 5,500 g/(m²·day) when measured in accordance to the Water Vapor Transmission Rate Test method.

C. A film comprising:
  a layer of water-soluble polyvinyl alcohol; and
  a vapor-deposited inorganic coating joined to at least one surface of the layer of water-soluble polyvinyl alcohol, wherein the first vapor-deposited inorganic coating comprises a metal oxide and has a thickness of about 100 nanometers to about 500 nanometers; and
  wherein the vapor-deposited inorganic coating defines a plurality of microfractures extending along the surface of the inorganic coating, each of the plurality of microfractures having a length of about 5 microns to about 50 microns; and
  wherein the film has a thickness of about 76 microns and exhibits an oxygen transmission rate of about 8 cc/(m²·day) [0.5 cc/(100 m²·day)] to about 30 cc/(m²·day) [2.5 cc/(100 in²·day)] when measured in accordance to the Oxygen Transmission Rate Test method.

D1. A method of forming a film comprising:
  providing a layer of water-soluble polymeric material; and
  vapor depositing an inorganic coating to at least one surface of the layer of water-soluble polymeric material, wherein the inorganic coating comprises a metal oxide; and
  forming a plurality of microfractures extending along the surface of the inorganic coating.

D2. The method of paragraph D1, wherein the inorganic coating is vapor-deposited with a chemical vapor deposition process.

D3. The method of paragraph D2, wherein the chemical vapor deposition process is a plasma-assisted chemical vapor deposition process.

D4. The method of any of paragraphs D1 to D3, wherein forming the plurality of microfractures occurs by stretching.

D5. The method of any of paragraphs D1 to D3, wherein forming the plurality of microfractures occurs by bending.

D6. The method of any of paragraphs D1 to D3, wherein forming the plurality of microfractures occurs by an out of plane deformation.

D7. The method of any of paragraphs D1 to D3, wherein forming the plurality of microfractures occurs from web processing.

What is claimed is:
1. A film comprising:
  a layer of water-soluble polymeric material; and
  a vapor-deposited inorganic coating disposed on a surface of the layer, wherein the inorganic coating comprises a metal oxide, wherein the inorganic coating comprises a plurality of microfractures therein, wherein the microfractures define a plurality of discrete regions and each of the discrete regions has a maximum linear dimension of about 150 microns or less, wherein the plurality of microfractures enable the dissolution of the water-soluble polymeric material.

2. The film of claim 1, wherein the water-soluble polymeric material comprises polyvinyl alcohol.

3. The film of claim 1, wherein the inorganic coating consists of the metal oxide.

4. The film of claim 1, wherein the metal oxide comprises one or more of aluminum oxide, silicon oxide, magnesium oxide, and titanium oxide.

5. The film of claim 1, wherein the inorganic coating is directly attached to the surface of the layer.

6. The film of claim 1, wherein the surface of the layer is at least partially ablated.

7. The film of claim 6, wherein the surface of the layer is ablated by a helium-oxygen plasma.

8. The film of claim 6, wherein the surface of the layer is ablated by an argon-oxygen plasma.

9. The film of claim 1, wherein each of the microfractures has an overall length of from about 5 to about 50 microns.

10. The film of claim 1, wherein each of the microfractures has an overall width of about 1 micron or less.

11. The film of claim 1, wherein each of the microfractures extends entirely through the inorganic coating.

12. The film of claim 1, wherein each of the microfractures extends only partially through the inorganic coating.

13. The film of claim 1, wherein each of the discrete regions has maximum linear dimension of about 100 microns or less.

14. The film of claim 13, wherein each of the discrete regions has maximum linear dimension of about 35 microns or less.

15. An article comprising a film according to claim 1, wherein the film forms at least part of packaging for the article.

16. The article of claim 15, wherein the article is a soluble unit dose article.

17. The film of claim 1, the discrete regions are substantially uniform in size and shape.

18. The film of claim 17, wherein the shape is substantially rectangular or square.

* * * * *